US012738906B2

(12) United States Patent
Kim et al.

(10) Patent No.: US 12,738,906 B2
(45) Date of Patent: Sep. 15, 2026

(54) POWER AMPLIFIER DEVICE HAVING DIES WITH ELONGATED BONDPADS CONNECTED THROUGH A DEVICE SUBSTRATE

(71) Applicant: NXP USA, Inc., Austin, TX (US)

(72) Inventors: Kevin Kim, Chandler, AZ (US); Vikas Shilimkar, Chandler, AZ (US); Joseph Gerard Schultz, Wheaton, IL (US)

(73) Assignee: NXP USA, INC., Austin, TX (US)

( * ) Notice: Subject to any disclaimer, the term of this patent is extended or adjusted under 35 U.S.C. 154(b) by 787 days.

(21) Appl. No.: 17/823,127

(22) Filed: Aug. 30, 2022

(65) Prior Publication Data

US 2024/0072740 A1 Feb. 29, 2024

(51) Int. Cl.
*H03F 3/24* (2006.01)
*H03F 1/02* (2006.01)
(Continued)

(52) U.S. Cl.
CPC ........... *H03F 3/245* (2013.01); *H03F 1/0288* (2013.01); *H03F 3/195* (2013.01); *H10W 44/20* (2026.01);
(Continued)

(58) Field of Classification Search
CPC .. H03F 3/245; H03F 1/0288; H03F 2200/451; H03F 3/195; H03F 1/02;
(Continued)

(56) References Cited

U.S. PATENT DOCUMENTS 6,724,079 B2 4/2004 Viswanathan et al.
6,844,221 B2 1/2005 Viswanathan et al.
(Continued)

FOREIGN PATENT DOCUMENTS

EP 3264455 A1 1/2018
EP 3376535 A1 9/2018
EP 3982406 A2 4/2022

OTHER PUBLICATIONS

Dinulovic et al.: "Power Microtransformer on Silicon Embedded into PCB", 2021 Third International Symposium on BD Power Electronics Integration and Manufacturing (3D-PEIM), Conference Paper—Publisher: IEEE, 2021, 4 pages.
(Continued)

*Primary Examiner* — Julio J Maldonado
*Assistant Examiner* — Alexander Michael Miller
(74) *Attorney, Agent, or Firm* — Sherry W. Gourlay

(57) ABSTRACT

A power amplifier device includes first and second power transistor dies and a substrate. Each die includes an elongated bondpad and an integrated transistor with a terminal that is coupled to the elongated bondpad. The substrate is formed from a stack of multiple dielectric layers and multiple patterned conductive layers in an alternating arrangement, and a plurality of conductive vias electrically coupling portions of the conductive layers. The substrate includes elongated first and second die contacts exposed at a first substrate surface and connected to the first and second elongated bondpads, respectively. The substrate also includes a conductive structure connected between the first and second die contacts. The conductive structure is formed from portions of the patterned conductive layers and at least two vias of the plurality of conductive vias.

21 Claims, 20 Drawing Sheets

(51) Int. Cl.
*H03F 3/195* (2006.01)
*H10W 44/20* (2026.01)

(52) U.S. Cl.
CPC ..... *H03F 2200/451* (2013.01); *H10W 44/206* (2026.01); *H10W 44/209* (2026.01); *H10W 44/234* (2026.01)

(58) Field of Classification Search
CPC ......... H01L 2223/6616; H01L 23/5226; H01L 2223/6644; H01L 23/36; H01L 23/5389; H01L 23/485; H01L 24/09; H01L 23/538; H01L 23/5383; H01L 23/5384; H01L 23/5386; H01L 2224/023; H01L 2224/024; H01L 25/072; H10W 44/20; H10W 44/206; H10W 72/073; H10W 90/00; H10W 44/00; H10W 44/234
See application file for complete search history.

(56) References Cited

U.S. PATENT DOCUMENTS

| | | | | |
|---|---|---|---|---|
| 9,013,246 | B2 | 4/2015 | Holmes et al. | |
| 9,202,782 | B2 | 12/2015 | Chuah | |
| 9,252,085 | B2 | 2/2016 | Weinschenk | |
| 9,986,646 | B2 | 5/2018 | Viswanathan et al. | |
| 10,784,149 | B2 | 9/2020 | Costa et al. | |
| 10,903,182 | B1 | 1/2021 | Wang et al. | |
| 11,190,146 | B2 | 11/2021 | Srinidhi Embar et al. | |
| 2002/0074146 | A1 | 6/2002 | Okubora | |
| 2003/0165052 | A1 | 9/2003 | Negishi et al. | |
| 2008/0315398 | A1 | 12/2008 | Lo et al. | |
| 2010/0155931 | A1 | 6/2010 | Ray et al. | |
| 2014/0070397 | A1* | 3/2014 | Viswanathan | H10W 40/228 257/706 |
| 2018/0159479 | A1 | 6/2018 | Wu et al. | |
| 2019/0088621 | A1* | 3/2019 | Yang | H01L 25/0657 |
| 2020/0027814 | A1* | 1/2020 | Ichiryu | H10W 20/48 |
| 2020/0203291 | A1 | 6/2020 | Uejima | |
| 2021/0075374 | A1* | 3/2021 | Wang | H03F 1/0288 |
| 2021/0111091 | A1 | 4/2021 | Uppal et al. | |
| 2021/0175854 | A1 | 6/2021 | Hue et al. | |
| 2021/0313282 | A1 | 10/2021 | Noori et al. | |
| 2021/0313284 | A1 | 10/2021 | Noori et al. | |
| 2021/0313285 | A1 | 10/2021 | Noori et al. | |
| 2021/0313293 | A1 | 10/2021 | Noori et al. | |
| 2022/0115301 | A1 | 4/2022 | Bowers et al. | |

OTHER PUBLICATIONS

Kuo et al: "High Efficiency Power Electronic Module with Embedded Die", 2016 IEEE CPMT Symposium Japan (ICSJ), Conference Paper, Publisher IEEE, 2016, 4 pages.
Mark Lapedus "Embedded Die Packaging Emerges", Semiconductor Engineering, Apr. 9, 2018, 15 pages.
U.S. Appl. No. 17/823,122 Notice of Allowance issued Apr. 2, 2025, 7 pages.
U.S. Appl. No. 18/054,971 Non Final Office Action dated May 28, 2025, 13 pages.
U.S. Appl. No. 17/823,116 Notice of Allowance issued on Apr. 4, 2025, 7 pages.
U.S. Appl. No. 17/823,116, filed Aug. 30, 2022 , 53 pages.
U.S. Appl. No. 17/823,122, filed Aug. 30, 2022 , 57 pages.
U.S. Appl. No. 18/054,971, filed Nov. 14, 2022, 74 pages.

* cited by examiner

POWER AMPLIFIER DEVICE HAVING DIES WITH ELONGATED BONDPADS CONNECTED THROUGH A DEVICE SUBSTRATE

TECHNICAL FIELD OF THE INVENTION

The present invention relates generally to power amplifiers that are packaged in semiconductor device packages.

BACKGROUND OF THE INVENTION

Wireless communication systems employ power amplifiers for increasing the power of radio frequency (RF) signals. Power amplifiers may be implemented in various ways, with a majority of power amplifiers being implemented on a printed circuit board (PCB). Circuit board implementations of power amplifiers may include, for example, input/output (I/O) connectors (e.g., coax connectors), surface mount components coupled to the surface of the PCB, and printed traces on the PCB that interconnect the connectors and the surface mount components.

In some cases, the primary amplification portion of a power amplifier includes one or more transistor dies. The transistor die(s) may be coupled to a PCB, along with I/O terminals, various surface mount components, and planar transmission lines. In some amplifiers, the transistor dies may include elongated bondpads at the input and/or output of the dies (i.e., bondpads having a length that is significantly greater than a width). Wirebond arrays are used to electrically connect the bondpads of the transistor die(s) to the planar transmission lines, and the planar transmission lines function to convey signals and voltages between the various die(s), components, and I/O terminals.

One issue with using wirebond arrays to connect the elongated die bondpads to the planar transmission lines is that it is difficult to achieve uniform power distribution across the length of the elongated bondpad(s). This is especially the case when, for example, a bondpad needs to be coupled through multiple wirebond arrays to more than one planar transmission line on the PCB (and thus to more than one circuit). For example, an output bondpad of a transistor die may be coupled to an output transmission line on the PCB using a first wirebond array, and the output bondpad also may be coupled to another transmission line and circuit using a second wirebond array. The two wirebond arrays may be implemented side-by-side (e.g., the two wirebond arrays may be coupled to separate but adjacent portions of the output bondpad). Because both of the wirebond arrays cannot be fully distributed along the entire length of the output bondpad, it may not be possible to achieve uniform power distribution across the length of the bondpad. This may result in sub-optimal performance, including limitations on maximum output power, gain, and efficiency. Accordingly, power amplifier designs are needed that overcome these issues.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

DETAILED DESCRIPTION

Figure 1:
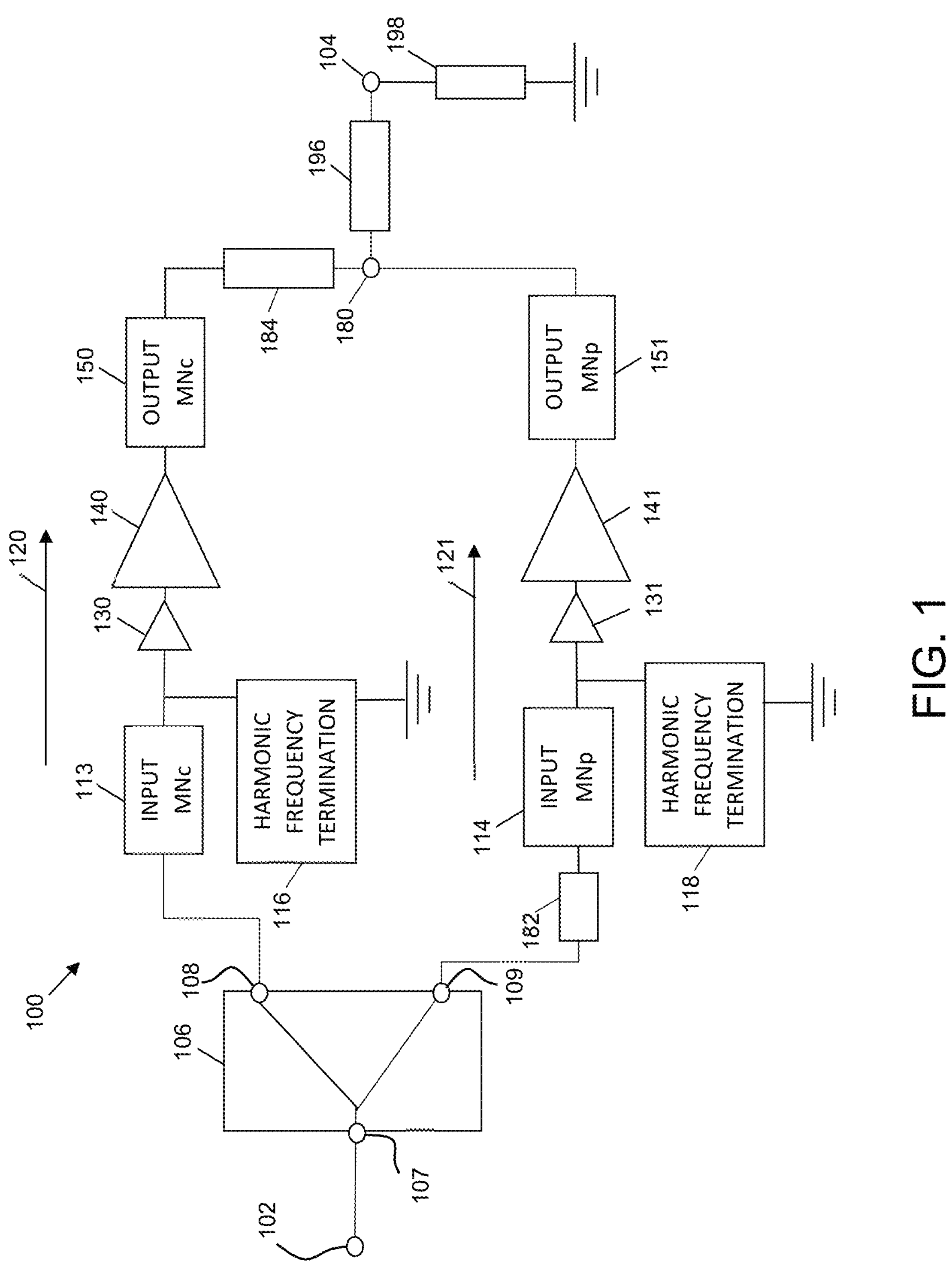
FIG. 1 is a simplified circuit diagram of a multi-path power amplifier, according to an embodiment.

Embodiments of power amplifiers described herein reduce or eliminate wirebond arrays from amplifier circuit, including elimination of wirebond arrays that are used in conventional amplifiers to electrically connect to the input and output bondpads of power transistor dies. Instead, in various embodiments, a "three dimensional" interconnect structure is used to connect power transistor die bondpads to each other and to other amplifier circuitry. Besides enabling more uniform power distribution along the lengths of the power transistor die bondpads, elimination of wirebond arrays may provide for increased amplifier power and efficiency, and minimized inductances that may enable compliance with higher band specifications. In addition, embodiments of power amplifiers described herein may facilitate miniaturization of RF amplifiers, which increasingly is becoming a critical aspect of power amplifier designs. Further still, in embodiments in which wirebond arrays are eliminated completely, the expensive wirebond assembly steps and wirebonder equipment may be eliminated, as well.

An embodiment of a power amplifier device includes first and second power transistor dies and a substrate. Each die includes an elongated bondpad and an integrated transistor with a terminal that is coupled to the elongated bondpad. The substrate is formed from a stack of multiple dielectric layers and multiple patterned conductive layers in an alternating arrangement, and a plurality of conductive vias electrically coupling portions of the conductive layers. The substrate includes elongated first and second die contacts exposed at a first substrate surface and connected to the first and second elongated bondpads, respectively. The substrate also includes a conductive structure connected between the first and second die contacts. The conductive structure is formed from portions of the patterned conductive layers and at least two vias of the plurality of conductive vias.

The power amplifier device embodiments described herein may be used to implement various types of amplifiers. Embodiments may be well suited for amplifiers that include multiple power transistor dies, each associated with an amplification stage (e.g., amplifiers with a series-coupled pre-amplifier and final stage amplifier). The embodiments also may be particularly well suited for multiple-path amplifiers (e.g., a multi-path amplifier with a main (or primary) amplifier and one or more auxiliary amplifiers implemented in series or parallel) and/or for amplifiers with transistor dies that generate high heat. For purpose of example, some of the below-described embodiments will be described in the context of a Doherty power amplifier, which is one non-limiting example of a multi-path amplifier in which the invention may be practiced. In fact, use of the below-described embodiments to provide a Doherty power amplifier may result in significant improvements in Doherty power amplifier performance and/or significantly reduced size. A schematic of a Doherty power amplifier will be described next in order to provide adequate context for the description of the various embodiments.

FIG. 1 is a simplified schematic diagram of a multiple-path power amplifier, and more specifically, a Doherty power amplifier 100, which may be embodied in an embodiment of an amplifier device, discussed later. Amplifier 100 includes an input terminal 102, an output terminal 104, a power divider 106 (or splitter), a carrier amplifier path 120, a peaking amplifier path 121, and a combining node 180. The combining node 180 may be coupled to a load 198 through an output conductor 196 (e.g., a transmission line and/or impedance transformer) and output terminal 104, so that the load 198 may receive an amplified RF signal from amplifier 100.

Power divider 106 includes an input terminal 107 and two output terminals 108, 109. An input RF signal received at input terminal 102 is conveyed to the input terminal 107 of the power divider 106, which divides the power of the input RF signal into carrier and peaking portions of the input signal. The carrier input signal is provided to the carrier amplifier path 120 at power divider output 108, and the peaking input signal is provided to the peaking amplifier path 121 at power divider output 109. During operation in a full-power mode when both the carrier and peaking amplifiers 140, 141 are supplying current to the load 190, the power divider 106 divides the input signal power between the amplifier paths 120, 121. For example, the power divider 106 may divide the power equally, such that roughly one half of the input signal power is provided to each path 120, 121 (e.g., for a symmetric Doherty amplifier configuration). Alternatively, the power divider 106 may divide the power unequally (e.g., for an asymmetric Doherty amplifier configuration).

Essentially, the power divider 106 divides an input RF signal supplied at the input terminal 102 into carrier and peaking signals, and the carrier and peaking signals are separately amplified along the carrier and peaking amplifier paths 120, 121, respectively. The amplified carrier and peaking signals are then combined in phase at the combining node 180. It is important that phase coherency between the carrier and peaking amplifier paths 120, 121 is maintained across a frequency band of interest to ensure that the amplified carrier and peaking signals arrive in phase at the combining node 180, and thus to ensure proper Doherty amplifier operation.

Each of the carrier amplifier and peaking amplifier paths 120, 121 includes one or more single-stage or multiple-stage power transistor integrated circuits (ICs) (or power transistor dies) for amplifying the RF signals conducted through the amplifier path. As shown in FIG. 1, the carrier amplifier path 120 includes a two-stage amplifier, which includes a pre-amplifier stage 130 and a final amplifier stage 140 (referred to collectively as the carrier amplifier 130, 140). Similarly, the peaking amplifier path 121 includes a two-stage amplifier, which includes a pre-amplifier stage 131 and a final amplifier stage 141 (referred to collectively as the peaking amplifier 131, 141). In each path, the pre-amplifier and final amplifier stages may be integrated into a single power transistor IC (or "power transistor die"), or the pre-amplifier and final amplifier stages may be integrated into two separate power transistor ICs. According to various embodiments, all amplifier stages or a final amplifier stage of either or both the carrier amplifier 130, 140 and/or the peaking amplifier 131, 141 may be implemented, for example, using a III-V field effect transistor (e.g., a HEMT), such as a gallium nitride (GaN) field effect transistor (FET) (or another type of III-V transistor, including a GaAs FET, a GaP FET, an InP FET, or an InSb FET). Where only one stage of the carrier amplifier 130, 140 or one stage of the peaking amplifier 131, 141 is implemented as a III-V FET, the other amplifier stage may be implemented as a silicon-based FET (e.g., an LDMOS FET) or a silicon germanium (SiGe) FET, in some embodiments. In still other embodiments, some or all of the amplifier stages may be implemented using silicon-based LDMOS (laterally diffused metal oxide semiconductor) transistors, SiGe transistors, or other types of transistors.

Although the carrier and peaking power transistor ICs may be of equal size (e.g., in a symmetric Doherty configuration), the carrier and peaking power transistor ICs may have unequal sizes, as well (e.g., in various asymmetric Doherty configurations). In an asymmetric Doherty configuration, the peaking power transistor IC(s) typically are larger than the carrier power transistor IC(s) by some multiplier. For example, the peaking power transistor IC(s) may be twice the size of the carrier power transistor IC(s) so that the peaking power transistor IC(s) have twice the current carrying capability of the carrier power transistor IC(s). Peak-ing-to-main amplifier IC size ratios other than a 2:1 ratio may be implemented, as well.

During operation of Doherty amplifier 100, the carrier amplifier 130, 140 is biased to operate in class AB mode, and the peaking amplifier 131, 141 is biased to operate in class C mode. At low power levels, where the power of the input signal at terminal 102 is lower than the turn-on threshold level of peaking amplifier 131, 141, the amplifier 100 operates in a low-power (or back-off) mode in which the carrier amplifier 130, 140 is the only amplifier supplying current to the load 198. When the power of the input signal exceeds a threshold level of the peaking amplifier 131, 141, the amplifier 100 operates in a high-power mode in which the carrier amplifier 130, 140 and the peaking amplifier 131, 141 both supply current to the load 198. At this point, the peaking amplifier 131, 141 provides active load modulation at combining node 180, allowing the current of the carrier amplifier 130, 140 to continue to increase linearly.

Optionally, input and output impedance matching networks 113, 150 (input MNc, output MNc) may be implemented at the input and/or output of the carrier amplifier 130, 140. Similarly, input and output impedance matching networks 114, 151 (input MNp, output MNp) optionally may be implemented at the input and/or output of the peaking amplifier 131, 141. In each case, the matching networks 113, 114, 150, 151 may be used to transform the gate and drain impedances of carrier amplifier 130, 140 and peaking amplifier 131, 141 to a more desirable system level impedance, as well as manipulate the signal phases to ensure proper Doherty amplifier operation. In various embodiments, all or portions of the input and output impedance matching networks 113, 114, 150, 151, if included, may be implemented inside a power amplifier package that includes the carrier and/or peaking amplifiers 140, 141.

In addition, embodiments of packaged amplifiers may include harmonic frequency termination circuits 116, 118 coupled between the inputs of amplifiers 140, 141 and a ground reference. In addition or alternatively, packaged amplifiers may include harmonic frequency termination circuits coupled between the outputs of amplifiers 140, 141 and a ground reference. Either way, the harmonic frequency termination circuits 116, 118 are configured to control the harmonic impedance across a relatively wide fractional bandwidth. For example, the harmonic frequency termination circuits 116, 118 may provide a low impedance path to ground for signal energy at the second harmonic of the center frequency of operation, fo, of the amplifier 100 (also referred to herein as the "fundamental frequency" of operation).

Doherty amplifier 100 has a "non-inverted" load network configuration. In the non-inverted configuration, the input circuit is configured so that an input signal supplied to the peaking amplifier 131, 141 is delayed by 90 degrees with respect to the input signal supplied to the carrier amplifier 130, 140 at the center frequency of operation, fo, of the amplifier 100. To ensure that the carrier and peaking input RF signals arrive at the carrier and peaking amplifiers 140, 141 with about 90 degrees of phase difference, as is fundamental to proper Doherty amplifier operation, phase delay element 182 applies about 90 degrees of phase delay to the peaking input signal. For example, phase delay element 182 may include a quarter wave transmission line, or another suitable type of delay element with an electrical length of about 90 degrees.

The 90 degree phase delay difference between the carrier and peaking amplifier paths 120, 121 at the inputs of amplifiers 140, 141 compensates for a 90 degree phase delay applied to the signal between the output of carrier amplifier 130, 140 and the combining node 180 (i.e., to ensure that the amplified signals arrive in phase at the combining node 180). This is achieved through an additional delay element 184, which also is configured to perform an impedance inversion (i.e., element 184 may be referred to as an impedance inverter/phase delay element or structure). Alternate embodiments of Doherty amplifiers may have an "inverted" load network configuration. In such a configuration, the input circuit is configured so that an input signal supplied to the carrier amplifier 130, 140 is delayed by about 90 degrees with respect to the input signal supplied to the peaking amplifier 131, 141 at the center frequency of operation, fo, of the amplifier 100. Additionally, the output circuit is configured so that an output signal supplied to the combining node 180 by the peaking amplifier 131, 141 is delayed by about 90 degrees with respect to the main amplifier 130, 140 at the center frequency of operation, fo, of the amplifier 100.

Amplifiers 140 and 141, splitter 106, harmonic frequency termination circuits 116, 118, matching networks 113, 114, 150, 151, and delay elements 182, 184 all may be implemented in a discrete, packaged power amplifier device, in accordance with various embodiments. In such devices, the input and output terminals 102, 104 are coupled to corresponding pads on a system substrate (e.g., a PCB). The harmonic frequency termination circuits 116, 118 and the input and output matching networks 113, 114, 150, 151 also may be implemented as additional components within the packaged amplifier. Baseband decoupling circuits, bias circuits, and other circuits also may be implemented as additional components within the packaged amplifier device.

Figures 2A, 2B:
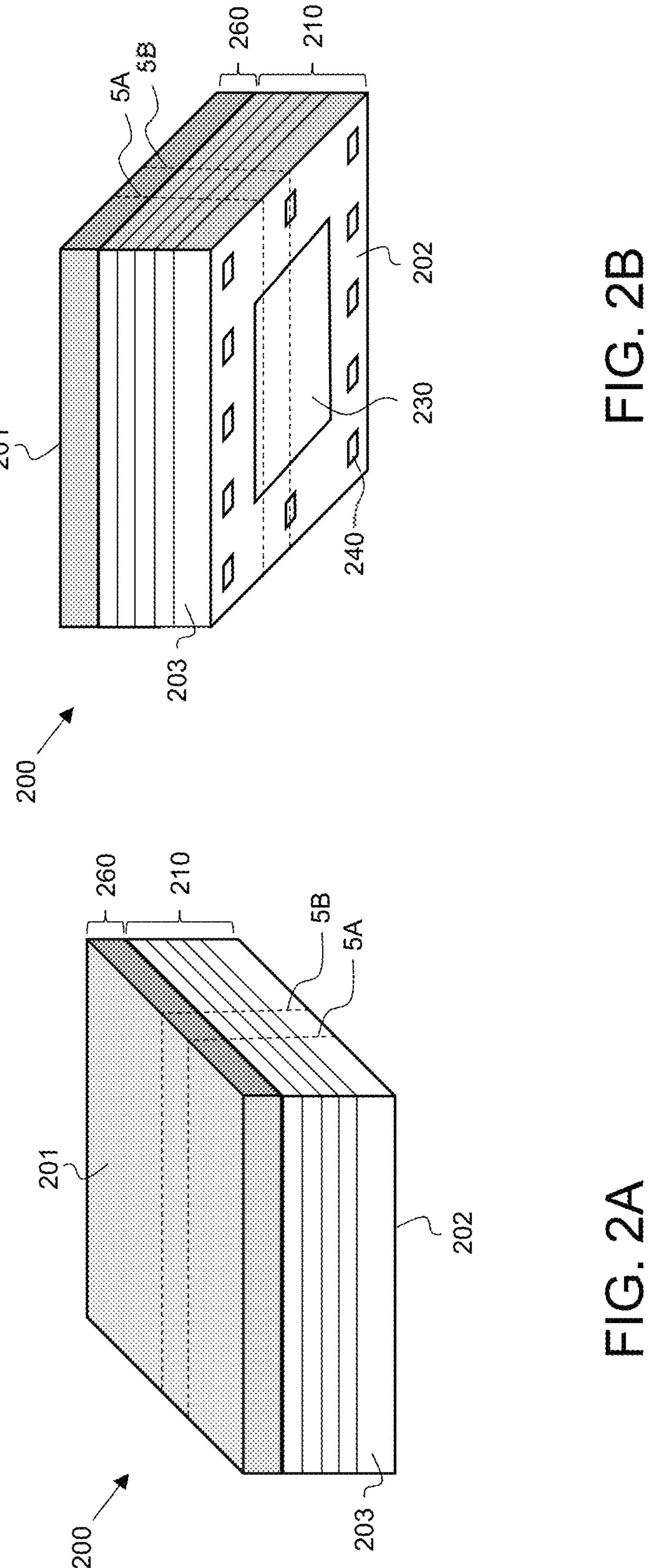
FIGS. 2A and 2B are perspective views showing the top and bottom surfaces, respectfully, of a power amplifier device, according to an example embodiment.

Turning now to FIGS. 2A and 2B (referred to collectively as FIG. 2), an embodiment of a power amplifier device 200 is depicted. More specifically, FIGS. 2A and 2B are perspective views showing the upper and lower surfaces 201, 202, respectfully, of a power amplifier device 200, according to an example embodiment. The power amplifier device 200 includes circuitry for a power amplifier, such as but not limited to Doherty power amplifier 100, FIG. 1.

The power amplifier device 200 has a device body shaped as a rectangular prism. The device body, and thus the device 200, is defined by a first device surface 201 (referred to herein as the upper device surface) and an opposed second device surface 202 (referred to herein as the lower device surface). Four device sidewalls (e.g., sidewall 203) extend between the upper and lower device surfaces 201, 202.

The device body includes an encapsulation material layer 260 connected to a substrate 210. The substrate 210, which partially defines the lower device surface 202 in some embodiments, is formed from a stack of multiple dielectric layers and multiple patterned conductive layers in an alternating arrangement. As will be discussed in more detail later in conjunction with FIGS. 4A-C and 5A-B, one or more power transistor dies (e.g., dies 440, 441, FIGS. 4A-C and 5A-B) are connected to substrate die contacts (e.g., contacts 430-433, FIGS. 4A-C and 5A-B) exposed at a first surface of the substrate 210 (e.g., substrate surface 511, FIGS. 5A-B). The first substrate surface is recessed below the lower device surface 202, and a thermal structure 230 contacts the embedded die(s) and extends outward to define a portion of the lower device surface 202.

According to an embodiment, a plurality of conductive interconnects 240 have distal ends exposed at the lower device surface 202. The conductive interconnects 240 extend into the die body, and their proximal ends are connected to additional substrate contacts and/or to the patterned conductive layers of the substrate 210. Essentially, the conductive interconnects 240 function as terminals configured to receive and convey RF signals, bias voltages, and ground connections to the amplifier circuitry (e.g., dies and surface mount components) embedded within the die body.

Figure 5A:
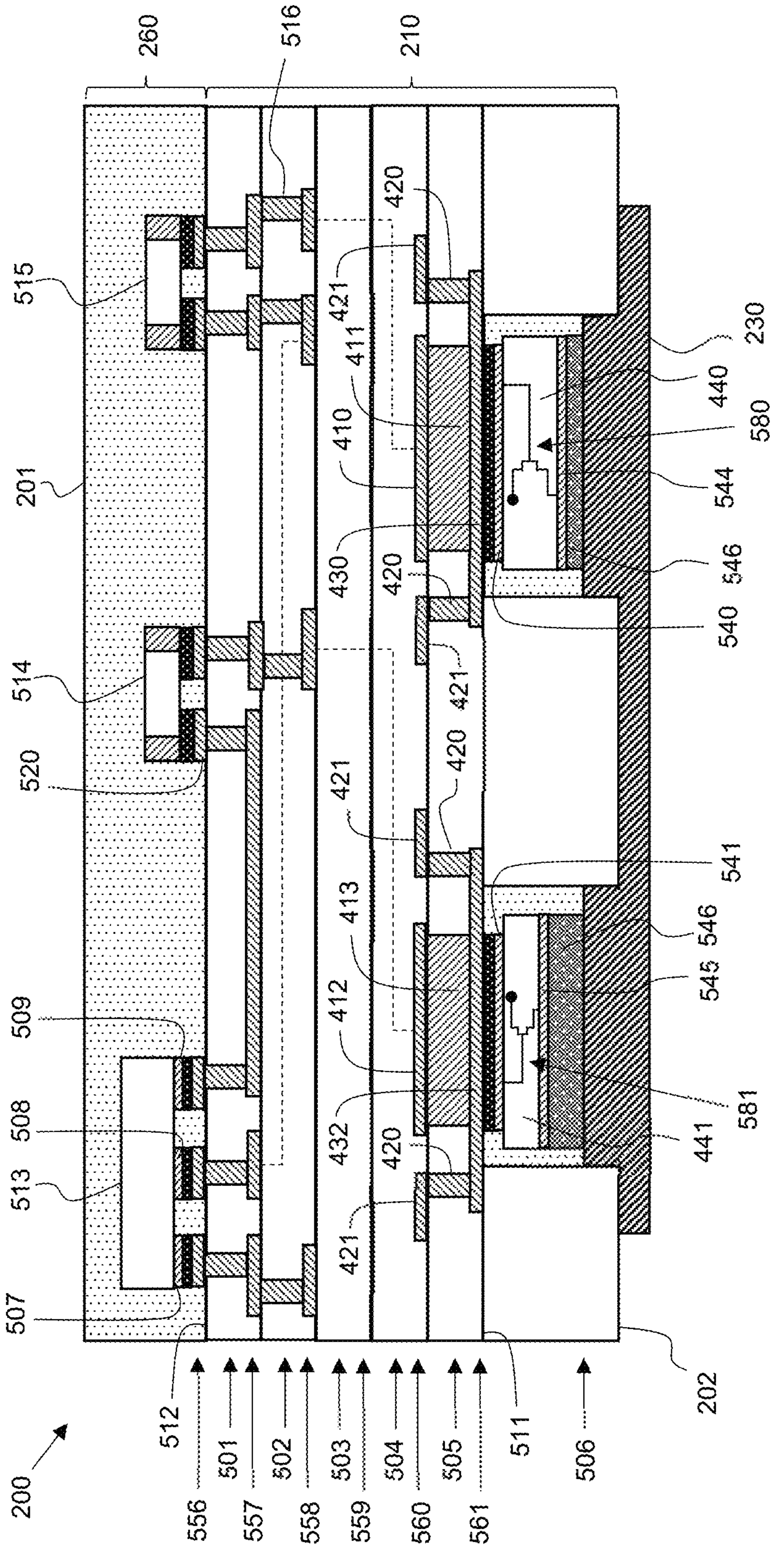
FIG. 5A is a side, cross-sectional view of the power amplifier device of FIG. 4A along bisection line 5A, according to an example embodiment.

In addition, one or more surface mount components (e.g., components 513, 514, 515, FIG. 5A) are connected to additional substrate contacts (e.g., contact 520, FIG. 5A) that are exposed at a second surface of the substrate 210 (e.g., substrate surface 512, FIG. 5A). The encapsulation material layer 260 covers the surface mount component(s) and the second substrate surface, and substantially defines the upper device surface 201.

As mentioned above in conjunction with FIG. 1, each of the amplifier stages 130, 131, 140, 141 may be implemented with a power transistor integrated in a semiconductor die (i.e., a "power transistor die"). For example, each of the pre-amplifier stages 130, 131 and final amplifier stages 140, 141 may be implemented as a power transistor in a separate die (i.e., with the four amplifier stages 130, 131, 140, 141 being implemented in four separate dies). In other embodiments, pre-amplifier stage 130 and final amplifier stage 140 may be integrated in one die, and pre-amplifier stage 131 and final amplifier stage 141 may be integrated in a separate, second die. Whether a single power transistor/amplifier stage is implemented in a die, or two power transistors/amplifier stages are implemented in a die (e.g., a pre-amplifier stage in series with a final amplifier stage), each die has an input bondpad (e.g., input bondpad 340, FIG. 3) coupled to a control terminal (e.g., gate terminal) of a power transistor within the die, and an output bondpad (e.g., output bondpad 342, FIG. 3) coupled to a current-conducting terminal (e.g., drain terminal) of a power transistor within the die.

Figure 3:
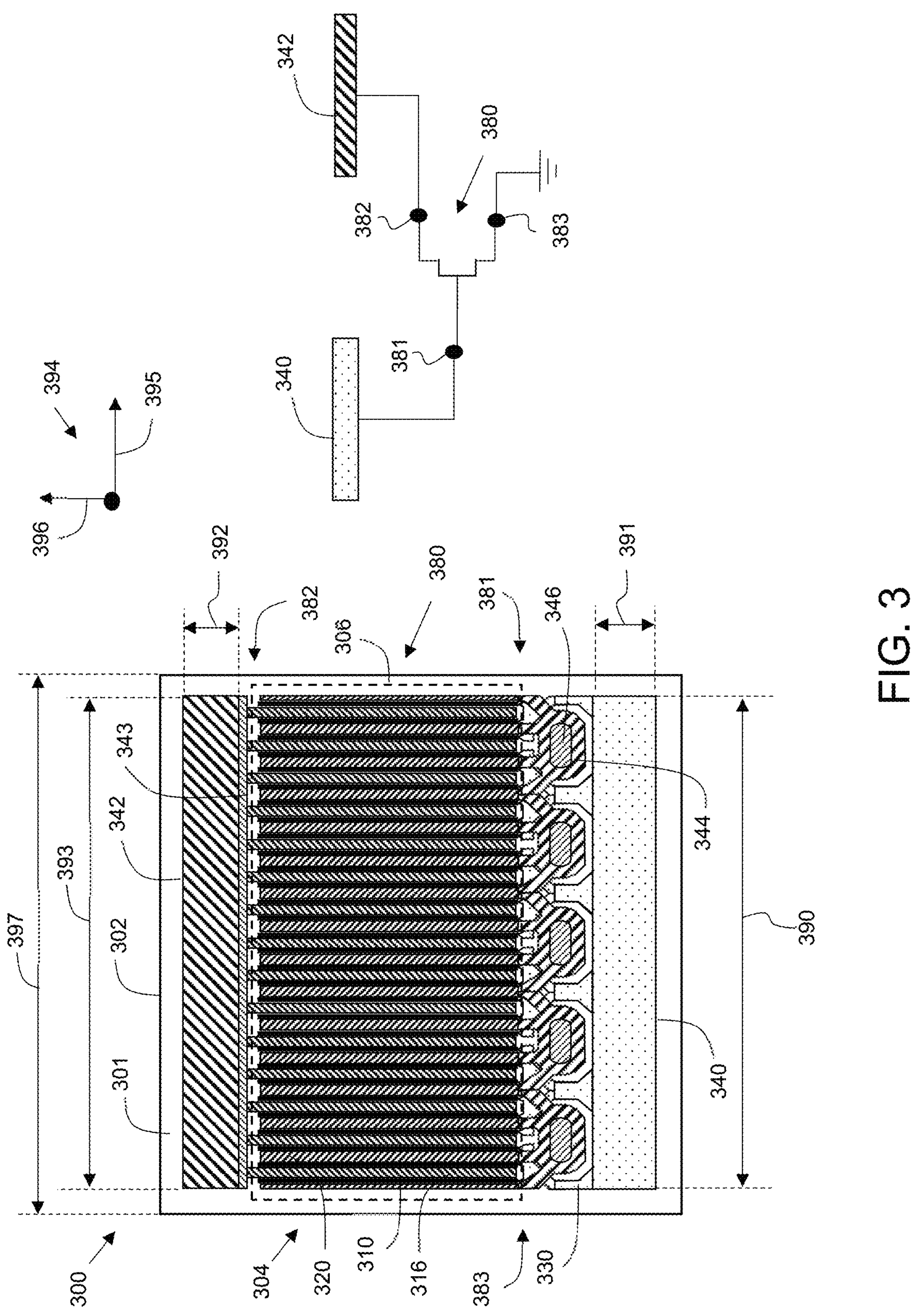
FIG. 3 is a top view of a power transistor die with elongated input and output bondpads, according to an example embodiment.

FIG. 3 is a top view of a power transistor die 300 that is suitable for use in an embodiment of a power amplifier device (e.g., device 200, FIG. 2), according to an example embodiment. More particularly, power transistor die 300 is a single-stage power transistor die that includes one integrated transistor/amplifier stage. As noted above, in alternate embodiments, a power transistor die may include a pre-amplifier stage coupled in series with a final amplifier stage.

Power transistor die 300 essentially is a multi-layer circuit integrated within a semiconductor die 302. FIG. 3 shows a view through a top surface 301 of the die 302. It should be understood that some of the elements shown in FIG. 3 are exposed at the top surface 301 of the die 302 (e.g., bondpads 340, 342), while other elements are buried below one or more dielectric layers (e.g., gate fingers 310, drain fingers 316, and source fingers 320), and thus may not be visible in an actual top view. Further, although some of the conductive features of die 300 are shown to overlap each other in the top view of FIG. 3, it should be understood that dielectric layers may be present between some of the overlapping features to ensure that the features are not shorted together (e.g., dielectric material would be present between gate conductors 330 and source conductors 344).

The semiconductor die 302 includes a semiconductor substrate composed of a base semiconductor substrate and a build-up structure coupled to the top surface of the base semiconductor substrate. The base semiconductor substrate may be formed, for example, from bulk or composite semiconductor materials (e.g., Si, GaN, GaAs, silicon-on-insulator (Sol), GaN-on-insulator (e.g., GaN on Si, GaN on silicon carbide, GaN on sapphire, and so on), or other suitable materials). The build-up structure is built up onto a surface of the base semiconductor substrate, and includes multiple dielectric layers that separate multiple patterned conductive layers, along with conductive vias that electrically connect portions of the conductive layers.

Power transistor die 300 includes an active region 304 formed in the substrate 302 between an input side of the die (bottom side in FIG. 3) and an output side of the die (top side in FIG. 3). The active region 304 is bounded by an outer periphery 306, enclosed in FIG. 3 with a dashed line box. The various structures and semiconductor regions within active region 304 constitute a power transistor 380, and an electrical model of the power transistor 380 is shown on the right side of FIG. 3. Essentially, the power transistor 380 is a three-terminal transistor with a gate terminal 381 (also referred to as an input terminal or a control terminal), a drain terminal 382 (also referred to as an output terminal or a first current-carrying terminal), and a source terminal 383 (also referred to as a second current-carrying terminal).

In the semiconductor device 300, the transistor itself is implemented with a plurality of parallel doped semiconductor regions (e.g., drain and source fingers 316, 320) in the base substrate, and a plurality of gate structures (e.g., gate fingers 310) in the build-up structure. More specifically, the transistor includes sets of interdigitated input gate fingers 310 (indicated with thick black vertical lines), output drain fingers 316 (indicated with vertical rectangles, which are cross-hatched from bottom left to top right), and common source fingers 320 (indicated with vertical rectangles, which are cross-hatched from top left to bottom right). The gate, drain, and source fingers 310, 316, 320 are disposed within substrate 302 in an interleaved configuration, and are oriented substantially parallel to one another with their lengths extending parallel to axis 396 in coordinate system 394. In alternate embodiments, a transistor may include more or fewer gate fingers, drain fingers, and source fingers than the numbers shown in FIG. 3.

The collective input-side ends of the gate fingers 310 represent the gate terminal 381, the collective output-side ends of the drain fingers 316 represent the drain terminal 382, and the collective input-side ends of the source fingers 320 represent the source terminal 383. Accordingly, the gate terminal 381 is coupled to the gate fingers 310, the drain terminal 382 is coupled to the drain fingers 316, and the source terminal 383 is coupled to the source fingers 320.

The gate and drain terminals 381, 382, in turn, are coupled to gate and drain bondpads 340, 342, respectively, that are exposed at the upper surface 301 of the die 302. More specifically, the input-side ends of the gate fingers 310 are coupled to the gate bondpad 340 through a series of gate conductors 330 (shaded with a stippled pattern), and the output-side ends of the drain fingers 316 are coupled to the drain bondpad 342 through a drain manifold 343.

In contrast, the source terminal 383 is coupled to a conductive bottom layer (e.g., layer 544, FIG. 5A) of the die 300, and the conductive bottom layer defines a lower surface of the die 300. More specifically, the input-side ends of the source fingers 320 are coupled through a series of source conductors 344 and through substrate vias 346 (herein "source TSVs") to the above-mentioned conductive layer on the lower surface of the die 300. In the illustrated embodiment, the source TSV 346 are disposed between the active area 304 and the gate bondpad 340. The layout of power transistor die 300 thus represents an "end via" layout in which source TSVs 346 are placed outside the bounding box (outer periphery 306) defined by the active region 304. In other embodiments, the source TSVs 346 may be placed within the active region 304 (e.g., between various fingers) or may be placed between the active region 304 and the drain bondpad 342.

The gate bondpad 340 is positioned outside of the outer periphery 306 of the active region 304 at an input side of the die 300, and the drain bondpad 342 is positioned outside of the outer periphery 306 of the active region 304 at an output side of the die 300.

It is important to note at this point that an important feature of power transistor die 300 is that the gate and drain bondpads 340, 342 (or input and output bondpads) each are "elongated," meaning that their lengths 390, 393, respectively, are significantly greater than their widths 391, 392, respectively. As used herein, the "length" of a gate or drain bondpad 340, 342 is a bondpad dimension that is parallel to a first axis (e.g., axis 395 of coordinate system 394). It may be noted that the length dimension of the gate or drain bondpad 340, 342) is perpendicular to the length dimensions of the gate, drain, and source fingers 310, 316, 320, which extend parallel to a second axis (e.g., axis 396 of coordinate system 394). In other words, the length dimensions of the gate and drain bondpads 340, 342 are perpendicular to the length dimensions of the gate, drain, and source fingers 310, 316, 320). According to an embodiment, for example, a length 390 of the gate bondpad 340 may be at least five times greater than a width 391 of the gate bondpad 340. Similarly, a length 393 of the drain bondpad 342 may be at least five times greater than a width 392 of the drain bondpad 342. In other embodiments, the lengths 390, 393 may be at least ten times greater than the widths 391, 392 of the gate and drain bondpads 340, 342. According to another embodiment, the term "elongated," with respect to the lengths of each gate and drain bondpad 340, 342, means that the length of each bondpad is at least 50 percent of the width 397 of the die 300. Essentially, the gate bondpad 340 is elongated along a first axis (e.g., an axis parallel to axis 395 of coordinate system 394), and the drain bondpad 342 is elongated along a second axis (e.g., another axis that is parallel to axis 395). In the illustrated embodiments, the first and second axes are parallel to each other, as well. In other embodiments, the first and second axes may be orthogonal or otherwise not parallel.

The importance of the elongated bondpad feature will become apparent in the description of how the power transistor die 300 is incorporated into a power amplifier device (e.g., device 200, FIG. 2). Briefly, the elongated gate and drain bondpads 340, 342 enable the power transistor die 300 to be coupled to a substrate which, in turn, has elongated contacts (e.g., contacts 430-433, FIG. 4A). Essentially, the elongated substrate contacts may connect across the entire lengths or large portions of the entire lengths of the elongated gate and drain bondpads 340, 342. This enables more uniform power distribution across the length of the bondpads 340, 342, which may, in turn, result in increased performance, including improvements in maximum output power, gain, and efficiency.

Figure 4A:
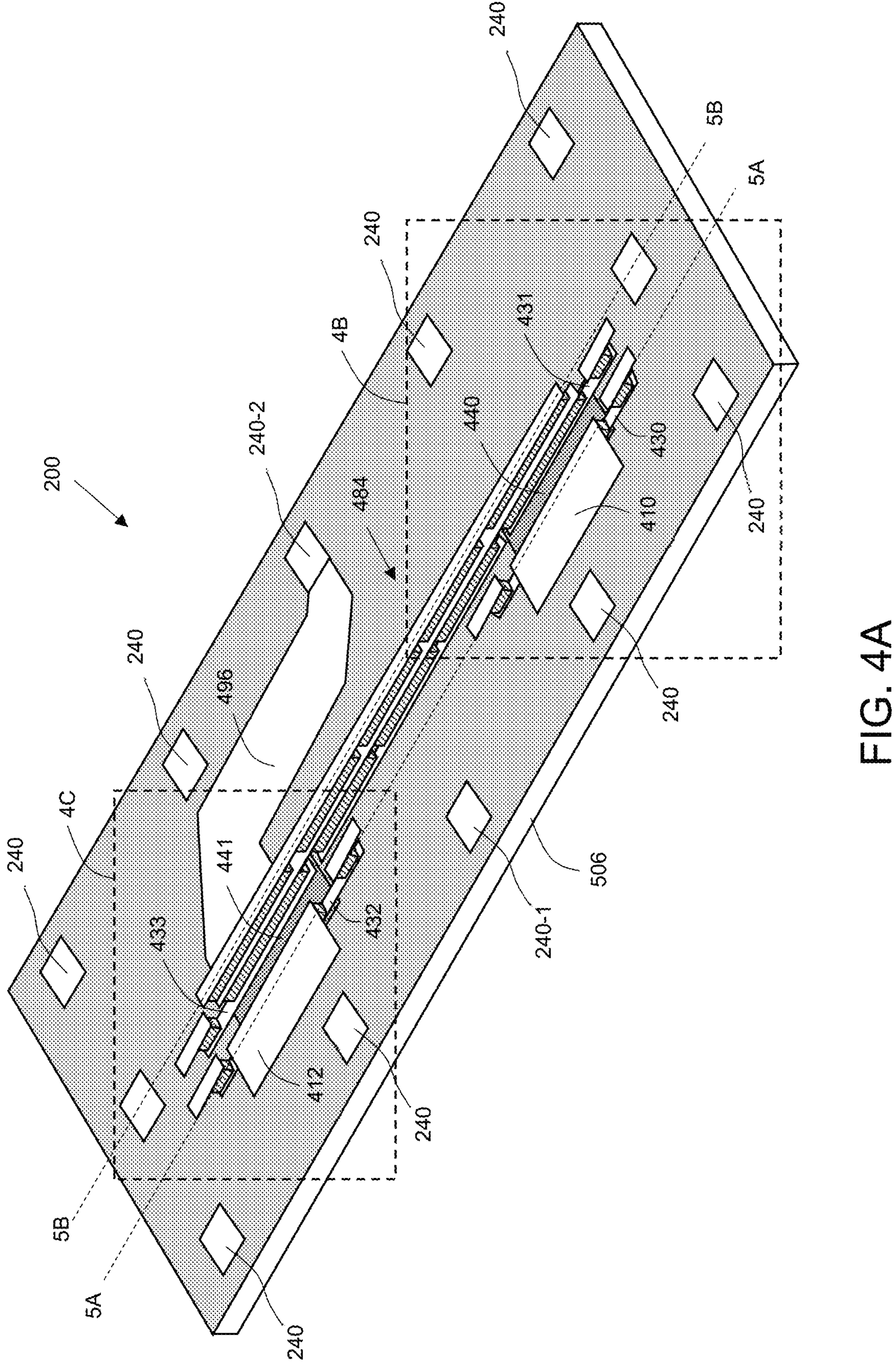
FIG. 4A is a perspective, cut-away view of a power amplifier device, according to an example embodiment.
Figure 4B:
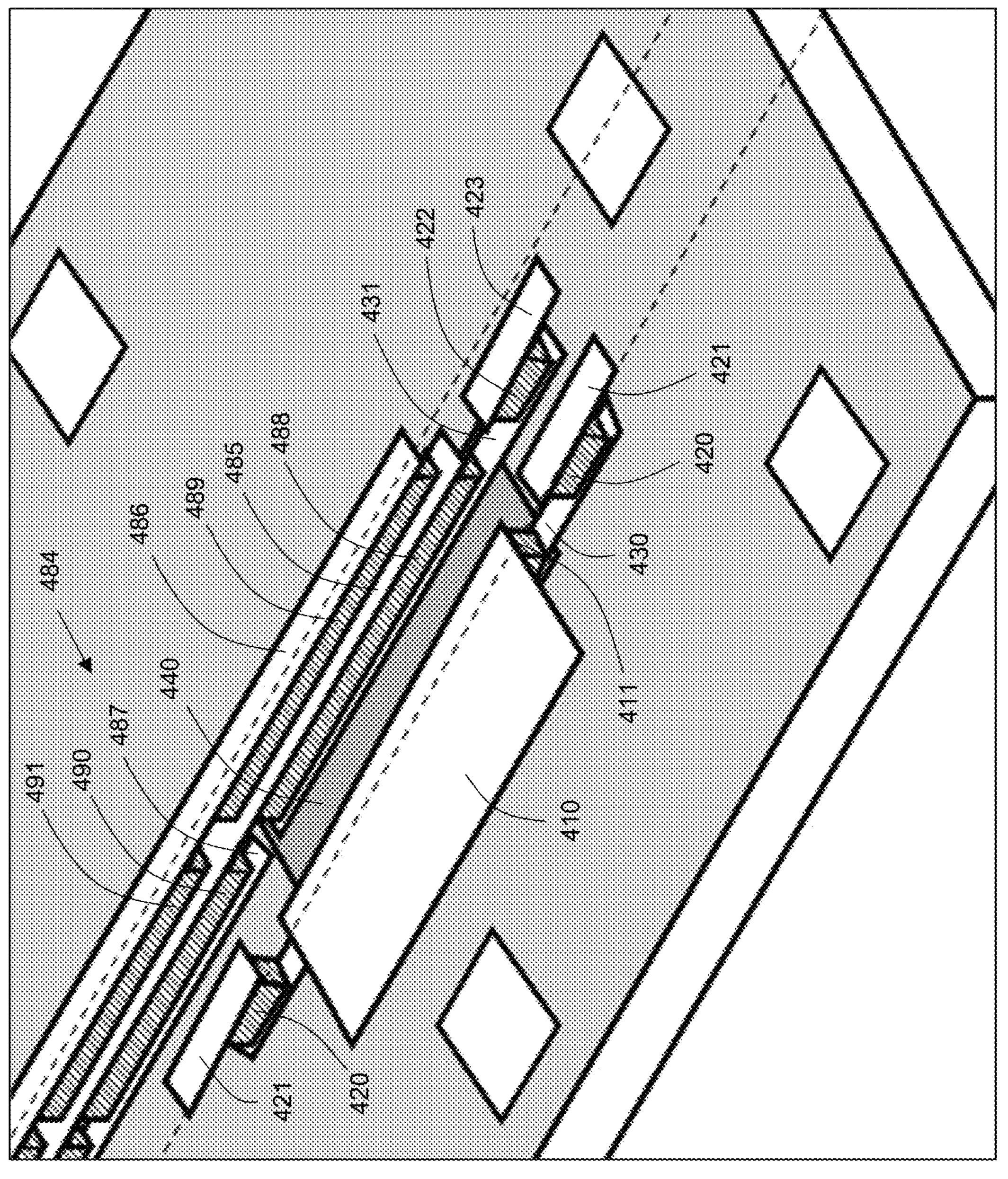
FIGS. 4B and 4C are close-up views of portions of the power amplifier device of FIG. 4A, according to example embodiments.
Figure 4C:
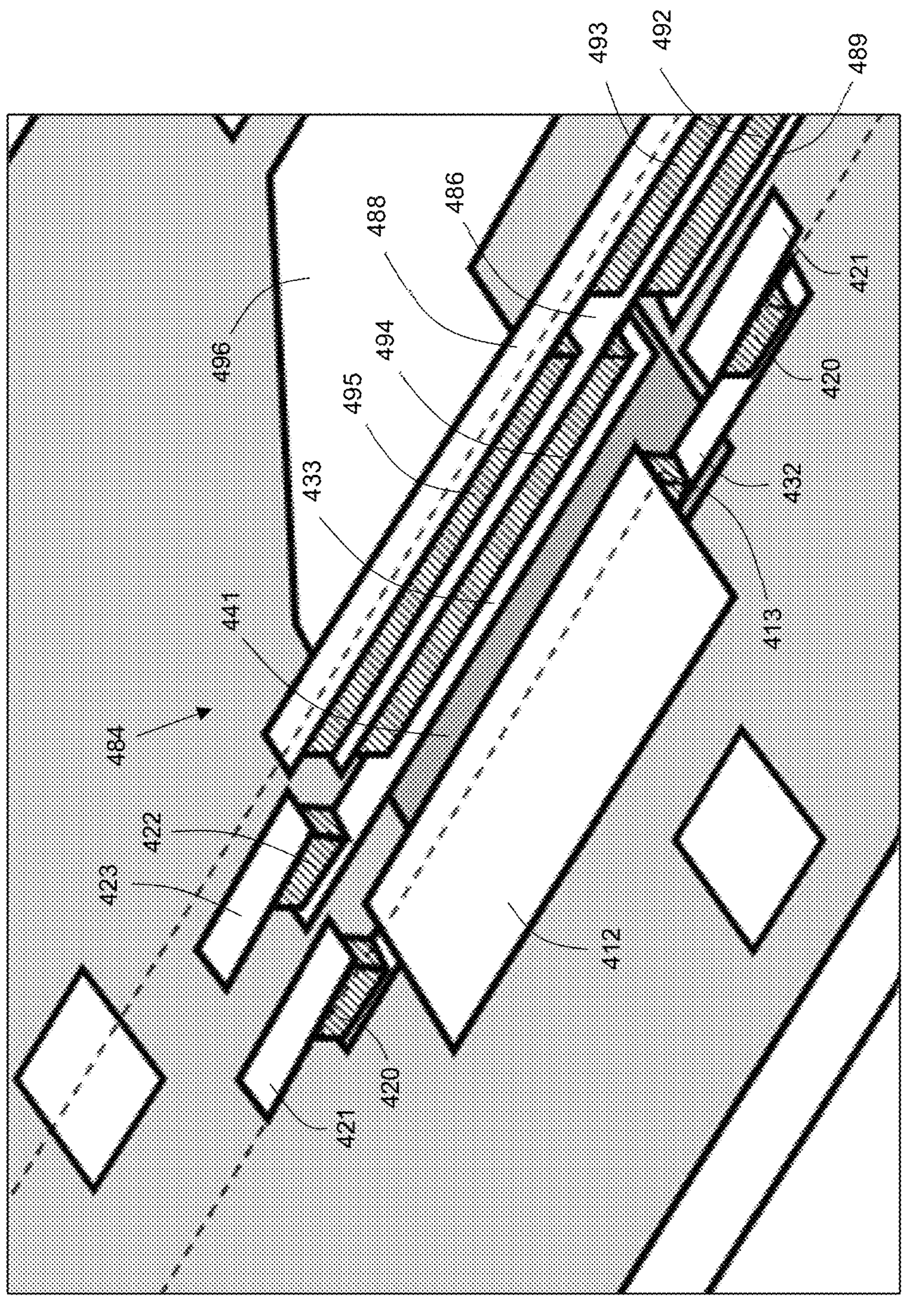
Figure 5B:
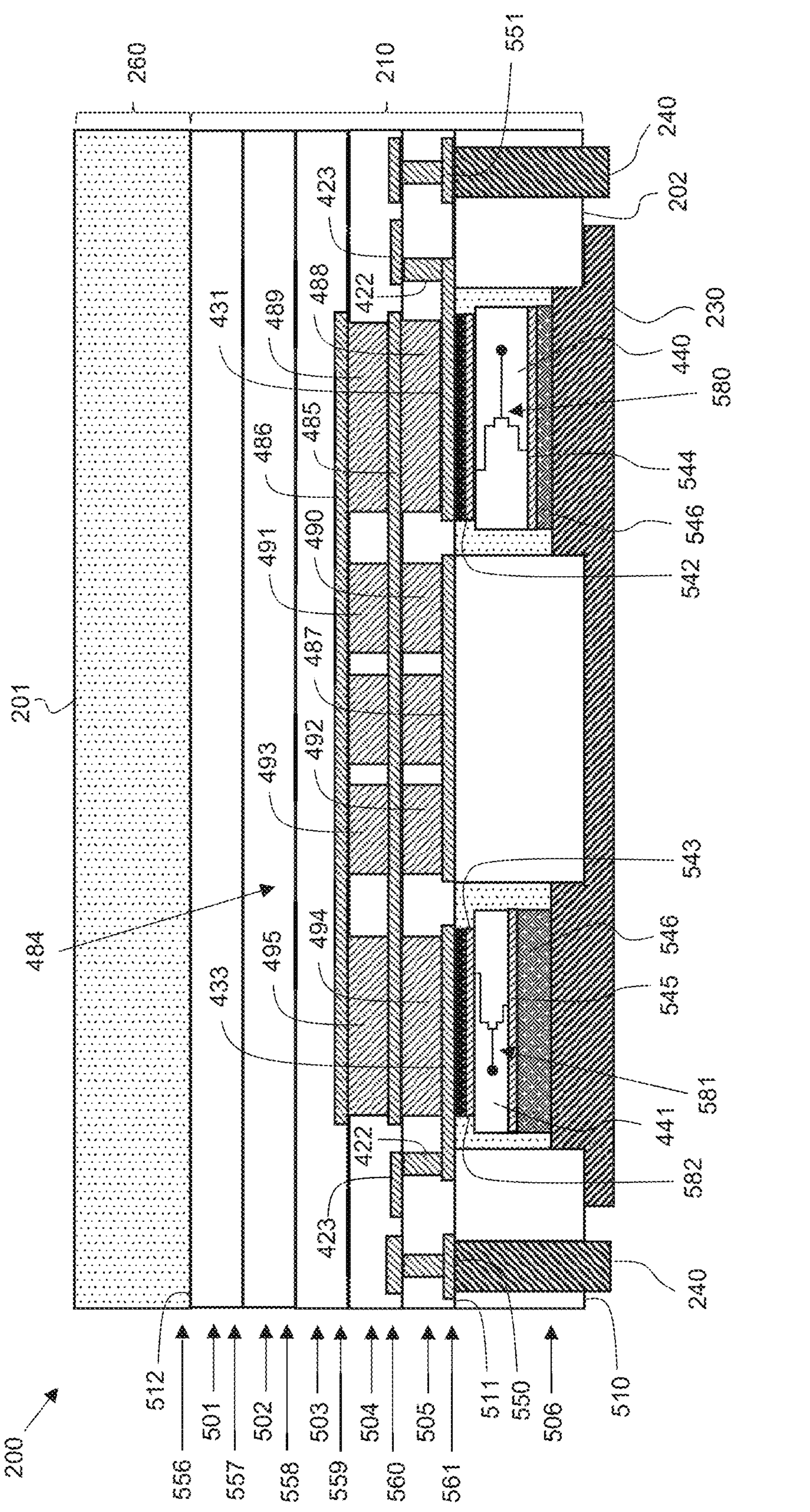
FIG. 5B is a side, cross-sectional view of the power amplifier device of FIG. 4A along bisection line 5B, according to an example embodiment.

FIG. 4A is a perspective, cut-away view of a power amplifier device 200, according to an example embodiment, and FIGS. 4B and 4C are close-up views of portions of the power amplifier device of FIG. 4A (i.e., portions enclosed by dashed rectangles 4B and 4C, respectively). For enhanced understanding, FIGS. 4A-C should be viewed in conjunction with FIGS. 5A and 5B. In particular, FIG. 5A is a side, cross-sectional view of the power amplifier device 200 of FIGS. 2 and 4A along bisection line 5A (i.e., a cross section through the gate bondpads 540, 541 of dies 440, 441), and FIG. 5B is a side, cross-sectional view of the power amplifier device 200 of FIGS. 2 and 4A along bisection line 5B (i.e., a cross section through the drain bondpads 542, 543 of dies 440, 441), according to example embodiments.

Figure 15:
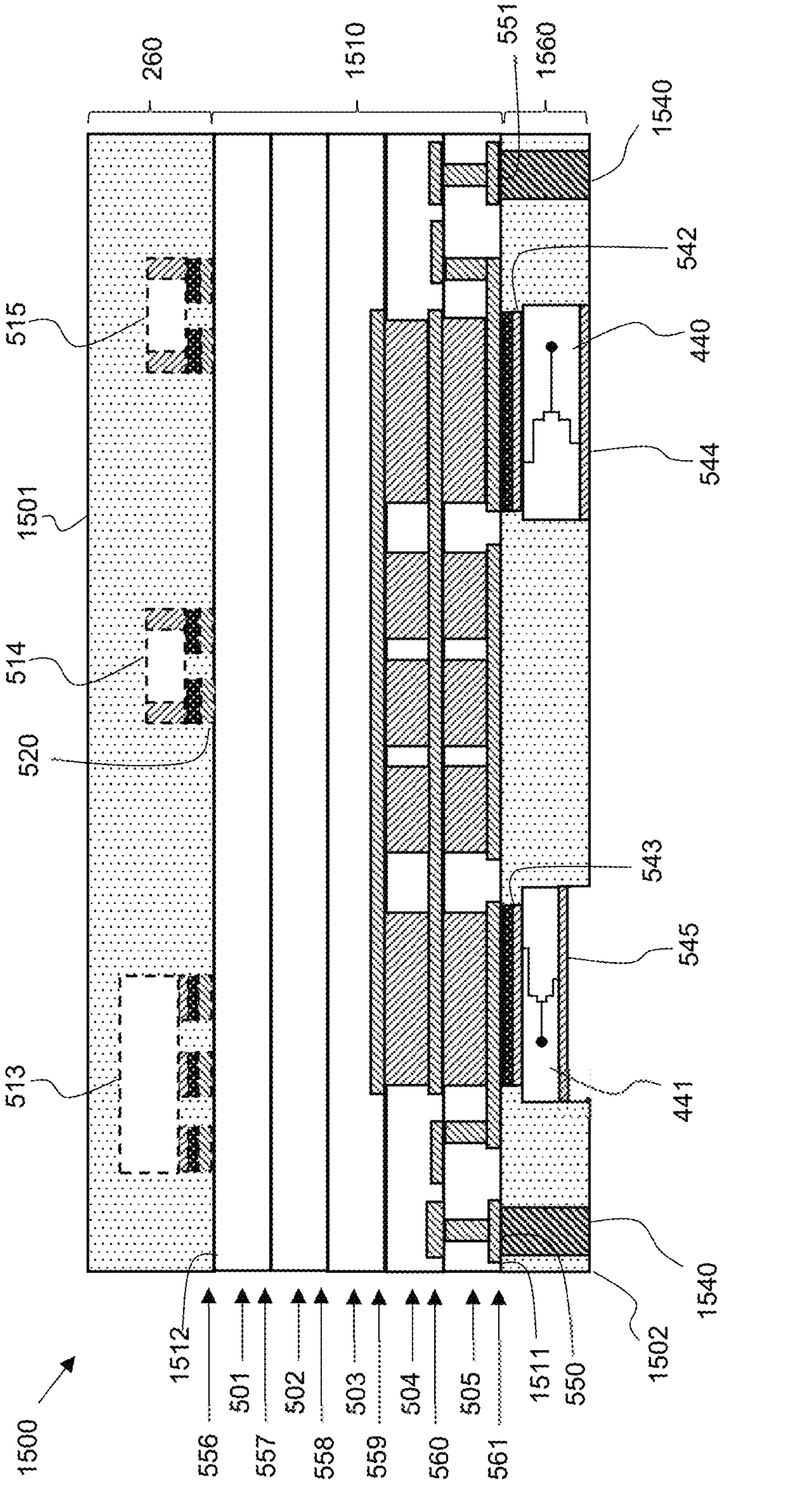
FIG. 15 is a side, cross-sectional view of yet another embodiment of a power amplifier device, according to another example embodiment.

Referring first briefly to FIG. 5A, and as discussed in conjunction with FIGS. 2A and 2B, power amplifier device 200 has a device body, which includes an encapsulation material layer 260 connected to a substrate 210. As shown in FIG. 5A, the substrate 210 is formed from a stack of multiple dielectric layers 501, 502, 503, 504, 505, 506 and multiple patterned conductive layers 556, 557, 558, 559, 560, 561 in an alternating arrangement. In an alternate embodiment, layer 506 may be a second encapsulation material layer (e.g., layer 1560, as shown in FIG. 15). A plurality of conductive vias (e.g., via 510) electrically connect the patterned conductive layers 556-561. In the view of FIGS. 4A-C, the encapsulation material layer 260 and dielectric layers 501-505 have been removed to more easily depict various structures associated with embodiments of the inventive subject matter. Of the dielectric layers 501-506, only dielectric layer 506 is depicted in FIGS. 4A-C, along with other inventive features.

Referring both to FIGS. 4A and 5A, two openings (e.g., openings 802, FIG. 8) in layer 506 of the substrate 210 expose one or more portions of an interior first substrate surface 511. A plurality of elongated substrate die contacts 430-433 are exposed at the first substrate surface 511. According to an embodiment, two power transistor dies 440, 441, each of which may have a configuration similar or identical to power transistor die 300 (FIG. 3), are connected to the substrate die contacts 430-433, and thus the dies 440, 441 are connected to the first substrate surface 511. The first substrate surface 511 is recessed below the lower device surface 202, in an embodiment, and a thermal structure 230 that extends into the die openings thermally couples to the embedded dies 440, 441 and extends outwardly to define a portion of the lower device surface 202.

According to an embodiment, the first power transistor die 440 includes at least one integrated transistor 580 (e.g., Si, GaN, SiGe, HEMT, LDMOS, etc.) that functions as the carrier amplifier (e.g., carrier amplifier 130, 140, FIG. 1) of a Doherty power amplifier (e.g., amplifier 100, FIG. 1). In addition, the second power transistor die 441 also includes at least one integrated power transistor 581 (e.g., Si, GaN, SiGe, HEMT, LDMOS, etc.) that functions as the peaking amplifier (e.g., peaking amplifier 131, 141, FIG. 1). As shown most clearly in FIG. 5A, the gate terminals (e.g., gate terminal 381, FIG. 3) of transistors 580, 581 are connected to the gate bondpads 540, 541, respectively, of the dies 440, 441. Additionally, the source terminals (e.g., source terminal 383, FIG. 3) of transistors 580, 581 are connected to a conductive bottom layer 544, 545 on the lower surface of the dies 440, 441. As shown most clearly in FIG. 5B, the drain terminals (e.g., drain terminal 382, FIG. 3) of transistors 580, 581 each are connected to the drain bondpads 542, 543, respectively, of the dies 440, 441.

In order to connect the dies 440, 441 to the substrate 210, the gate and drain bondpads 540-543 are coupled to the substrate die contacts 430-433 (e.g., using solder, sinter, conductive epoxy, or other conductive connections). As described in detail in conjunction with FIG. 3, the gate and drain bondpads 540-543 are elongated bondpads, according to an embodiment, meaning that their lengths are significantly greater than their widths, and/or that their lengths are at least 50 percent the width of each die 440, 441.

According to a further embodiment, each of the die contacts 430-433, which are exposed at surface 511 of the substrate 210, are shaped and sized to correspond to the shape and size of the gate or drain bondpad 540-543 to which the substrate die contact 430-433 is connected. In other words, the substrate die contacts 430-433 also are elongated, and further may have shapes and sizes that are substantially similar or identical to the shapes and sizes of the bondpads 540-543 to which they are connected, in order to ensure good connection along the entire lengths of the gate and/or drain bondpads 540-543, or at least along a substantial portion (e.g., 50-90 percent) of the gate and/or drain bondpads 540-543. During operation of device 200, this enables equal power distribution across the connections between the bondpads 540-543 and the substrate die contacts 430-433.

Additional aspects of the device 200 will now be discussed. Referring to FIGS. 5A and 5B, for example, a thermal structure 230 extends into the opening (or openings) of the outermost substrate layer(s) 506, and is coupled (e.g., using die attach 546, solder, or other suitable conductive materials) to the conductive bottom layers 544, 545 of the power transistor dies 440, 441, in an embodiment. As shown in FIGS. 5A and 5B, when the power transistor dies 440, 441 have different heights (vertical dimension in FIGS. 5A and 5B), the thickness of the die attach 546 may be different between each die 440, 441 and the thermal structure 230. Alternatively, the thermal structure 230 could be machined so that portions of the structure 230 that are coupled to the dies 440, 441 (e.g., "pedestals") have different heights to accommodate the different die heights. In such an embodiment, if the pedestal heights are configured so that each pedestal is the same distance from the corresponding die, the thickness of the die attach 546 can be the same for both dies 440, 441.

The outer surface of the thermal structure 230 corresponds to a portion of the lower surface 202 of the device 200. As will be explained in more detail later, the thermal structure 230 is configured to convey heat generated by the dies 440, 441 away from the dies 440, 441, and to an external system heat sink (e.g., heat extraction component 1330, 1430, 1632, FIGS. 13, 14, 16) associated with an amplifier system (e.g., a transmitter of a communication system).

As mentioned initially when describing FIG. 2B, a plurality of conductive interconnects 240 have distal ends exposed at the lower device surface 202. The conductive interconnects 240 extend through the outermost substrate layer(s) 506, and their proximal ends are electrically connected to the patterned conductive layers 556-561 of the substrate 210. These connections may be made through interconnect contacts (e.g., contacts 550, 551, FIG. 5B). For example, the interconnect contacts 550, 551 may be positioned at the first substrate surface 511. As mentioned previously, the conductive interconnects 240 (FIG. 2B) are configured to convey RF signals, bias voltages, control signals, and ground connections to the amplifier circuitry (e.g., dies 440, 441 and surface mount components 513, 514, 515) embedded within the device 200. In FIG. 4A, conductive interconnect 240-1 more specifically corresponds to an RF input terminal (e.g., terminal 102, FIG. 1), and thus is referred to as RF input interconnect 240-1. With reference to FIG. 4A or 5A, and although not completely shown, RF input interconnect 240-1 may be coupled through the substrate 210 to the input of a power divider circuit (e.g., input 507 of surface mount component 513, FIG. 5A). Further, outputs of the power divider circuit (e.g., outputs 508, 509 of component 513, FIG. 5A) may be coupled through the substrate 210 to patterned input conductors 410, 412 (FIGS. 4A-C), which in turn are coupled through elongated vias 411, 413 to the elongated substrate die contacts 430, 432 and the elongated gate bondpads 540, 541 of the dies 440, 441.

The input conductors 410, 412 each are formed from a portion of one of the patterned conductive layers (e.g., portions of layer 560, or another layer). According to an embodiment, each input conductor 410, 412 and each underlying via 411, 413 has a width (horizontal dimension in FIG. 5A) that may be approximately equal to the length of the elongated gate bondpad 540, 541 (e.g., each conductor 410, 412 and via 411, 413 may have a width of about 80-120 percent the length of the bondpad 540, 541 to which they connect). Accordingly, during operation of device 200, this enables equal power distribution across gate bondpads 540, 541.

With continued reference to FIG. 5A, in some embodiments, the substrate die contacts 430, 432 may extend beyond the ends of the gate bondpads 540, 541 to enable additional conductive vias 420 within substrate 210 to be directly connected to the die contacts 430, 432 (and thus closely coupled to the gate bondpads 540, 541). Through additional patterned portions of the overlying conductive layers (e.g., portions 421) and additional conductive vias, these additional conductive vias 420 may be electrically connected to interconnects 240 and/or various other circuits integrated within the device 200 (e.g., bias circuits, harmonic frequency termination circuits, control circuits, and so on).

As also shown in FIG. 5A, device 200 also may include one or more surface mount components 513, 514, 515 coupled to a second surface 512 of substrate 210. To facilitate connection of the surface mount components 513-515 to substrate 210, additional substrate contacts 520 are exposed at the second surface 512 of the substrate 210.

The surface mount components 513-515 can correspond to a number of components of an amplifier circuit (e.g., pre-amplifier transistors, power splitting circuitry, harmonic termination circuitry, inductors, capacitors, and impedance matching circuitry). For example, as mentioned previously, at least one surface mount component 513 may correspond to a power divider circuit (e.g., power divider 106, FIG. 1), which has an input terminal 507 (e.g., terminal 107, FIG. 1) and multiple output terminals 508, 509 (e.g., terminals 108, 109, FIG. 1). The power divider input terminal 507 is electrically coupled through a conductive path formed from portions of the patterned conductive substrate layers 556-561 and vias to one of the conductive interconnects (e.g., interconnect 240-1, FIG. 4A), which corresponds to the input terminal (e.g., input terminal 102, FIG. 1) of the amplifier.

Each output terminal 508, 509 of the power divider circuit 513 is coupled to one of the inputs (e.g., drain terminals) of the transistors 580, 581 within the power transistor dies 440, 441. The output terminals 508, 509 of the power divider circuit 513 may be coupled to the inputs of the power transistor dies 440, 441 (e.g., to input conductors 410, 412) directly through conductive paths formed by the patterned conductive layers 556-561 and vias (e.g., via 516). Alternatively, as shown in FIG. 5A, the output terminals 508, 509 of the power divider circuit 513 may be coupled through conductive paths in the substrate 210 to additional surface mount components 514, 515, which correspond to portions of input impedance matching circuits (e.g., circuits 113, 114, FIG. 1). Those additional surface mount components 514, 515, in turn, may be coupled to the inputs of the power transistor dies 440, 441 (e.g., to input conductors 410, 412) directly through conductive paths formed by the patterned conductive layers 556-561 and vias (e.g., via 516). Note that, in FIG. 5A and other figures described later, some conductive paths are indicated with dashed lines.

Accordingly, when an input RF signal is provided to RF input interconnect 240-1 (FIG. 4A), the input RF signal may be conveyed through the substrate 210 to the input terminal 507 of the power divider circuit 513, and the power divider circuit 513 may perform the function of splitting the input RF signal into multiple (e.g., two or more) separate signals (e.g., a carrier signal and a peaking signal). The separate signals provided at the power divider output terminals 508, 509 may then be conveyed through the substrate 210 to the impedance matching components 514, 515 or directly to the input conductors 410, 412 for the power transistor dies 440, 441. Although the power divider circuit 513 is shown as a single surface-mount component, in other embodiments, multiple surface mount components may be used to implement the power divider circuit 513.

Although not shown in FIG. 5A, at least one additional surface-mount component may be used to implement a harmonic termination circuit (e.g., harmonic termination circuits 116, 118, FIG. 1) coupled between each amplification path and ground. For example, when a harmonic termination circuit includes a shunt LC circuit, at least part of the inductance (L) can be implemented using a series of conductive traces and vias of the patterned conductive layers 556-561, another part of the inductance (L) can be implemented with a surface mount component coupled to contacts at substrate surface 512, and the capacitance (C) can be a surface mount component coupled to additional contacts at substrate surface 512. The inductance (L) and capacitance (C) can be coupled in series through the patterned conductive layers 556-561. An input to each LC circuit can be coupled to a point along each of the amplification paths (e.g., a point before or after each power transistor), and an output to each LC circuit can be coupled through the patterned conductive layers 556-561 to another one of the conductive interconnects 240. When the device 200 is incorporated into a larger system, that conductive interconnect 240 can be coupled to ground.

As discussed in conjunction with FIG. 1, for a non-inverted Doherty amplifier, a phase delay element (e.g., phase delay element 182, FIG. 1) is coupled between the power divider 106 and the input to the peaking amplifier 131, 141. According to an embodiment, the phase delay element (e.g., phase delay element 182, FIG. 1) may be implemented using a conductive path through the substrate 210, which electrically couples an output of the power divider circuit 513 to an input (e.g., gate bondpad 541) of the peaking amplifier die (e.g., through impedance matching component 514, various traces and vias, and substrate contact 432). The conductive path corresponding to the phase delay element may have an electrical length of about 90 degrees, according to an embodiment.

The encapsulation material layer 260 covers the surface mount components 513-515 and the second substrate surface 512. The encapsulation material layer 260 essentially defines the upper device surface 201 of device 200. According to an embodiment, sidewalls of the substrate 210 and the encapsulation material layer 260 that are on the same side of the device 200 are co-planar.

During operation, each power transistor die 440, 441 receives an RF signal (e.g., a carrier or peaking signal) at its gate bondpad 540, 541, and each power transistor die 440, 441 amplifies the received signal to produce an amplified RF signal at its drain bondpad (542, 543, FIG. 5B).

The output side of the power transistor dies 440, 441 will now be discussed, with particular reference to FIGS. 4A-C and 5B. As discussed in conjunction with FIG. 1, the outputs of the carrier and peaking power amplifiers 140, 141 each are coupled to a combining node 180. According to an embodiment, the combining node, indicated in FIG. 5B with reference number 582, is co-located with the output bondpad (e.g., drain bondpad 543) of the peaking amplifier die 441. Accordingly, the amplified RF signal produced by the peaking amplifier die 441 at drain bondpad 543 is received at the combining node 582 by virtue of being produced at the drain bondpad 543.

An impedance inverter/phase delay structure 484 (e.g., impedance inversion/phase delay element 184, FIG. 1) is coupled between the drain bondpads 542, 543 (i.e., between drain bondpad 542 and combining node 582) to electrically connect the output of power transistor die 440 (e.g., a carrier amplifier die) to the combining node 582. More specifically, the impedance inverter/phase delay structure 484 is implemented using a conductive structure within the substrate 210, which electrically connects the output bondpad (e.g., drain bondpad 542) of the carrier amplifier die 440 to the combining node 582 at the output bondpad (e.g., drain bondpad 543) of the peaking amplifier die 441.

Referring to FIGS. 4A-C and 5B, the impedance inverter/phase delay structure 484 includes a plurality of conductive traces 485-487 and a plurality of conductive vias 488-495 that electrically connect the plurality of conductive traces 485-487. In the illustrated embodiments, each via 488-495 is an elongated trench-type via. In other embodiments, some or all of the elongated trench-type vias 488-495 could be replaced with one or multiple circular vias.

In the example embodiment of FIGS. 4A-C and 5B, the impedance inverter/phase delay structure 484 is a two-level structure, but in alternate embodiments, the impedance inverter/phase delay structure 484 may be a single-level structure, or may have more than two levels. The first level of structure 484 includes a first elongated via 488 connected across substantially the entire length (horizontal dimension in FIG. 5B) of drain contact 431, a second elongated via 494 connected across substantially the entire length of drain contact 433, and a conductive trace 485 (formed from a portion of conductive layer 560) with a first end extending across and coupled to via 488, and a second end extending across and coupled to via 494. The first level of structure 484 also may include an additional conductive trace 487 extending between but electrically isolated from contacts 431 and 433. For example, the additional conductive trace 487 may be formed from a portion of conductive layer 561. A plurality of additional elongated (or circular) vias, such as vias 490 and 492, extend between and electrically connect conductive traces 485 and 487.

The second level of structure 484, if implemented, includes a third elongated via 489 stacked on trace 485 above via 488, a fourth elongated via 495 stacked on trace 485 above via 494, and yet another conductive trace 486 (formed from a portion of conductive layer 559) with a first end extending across and coupled to via 489, and a second end extending across and coupled to via 495. An additional plurality of additional elongated (or circular) vias, such as vias 491 and 493, extend between and electrically connect conductive traces 485 and 486. Although FIGS. 4A-C and 5B illustrate an impedance inverter/phase delay structure 484 that includes two levels and a particular number and configuration of conductive traces and vias, the number of levels and/or the number and configuration of vias may be adjusted to achieve a desired impedance transformation and phase delay between the drain contacts 431 and 433. According to an embodiment, the impedance inverter/phase delay structure 484 is designed to produce an impedance inversion between contacts 431, 433, and further to impart about a 90 degree phase delay to a signal conveyed between contacts 431 and 433.

As discussed in conjunction with FIG. 1, the combining node 180 is electrically coupled to the output terminal 104 of the amplifier. According to an embodiment, conductive interconnect 240-2 (FIG. 4A) functions as the RF output terminal of the amplifier device 200 (e.g. terminal 104, FIG. 1), and the combining node 582 and output bondpad (e.g., drain bondpad 543) of the peaking amplifier die 441 are electrically coupled to RF output interconnect 240-2 through a patterned output conductor 496 (FIGS. 4A, 4C, e.g., conductor 196, FIG. 1). The output conductor 496 may be formed from a portion of one of the patterned conductive layers of the substrate 210. As indicated in FIGS. 4A and 4C, the end of the output conductor 496 that connects to die contact 433 (and thus to drain bondpad 543) has a width that is close to the length of the drain bondpad 543, and that end of the output conductor 496 is aligned over substantially an entire width/length of the die contact 433 and the drain bondpad 543. Accordingly, an equal power distribution may be achieved in the connection between the drain bondpad 543 and the output conductor 496.

According to one embodiment, the output conductor 496 is formed from the same conductive layer 561 as the die contact 433. In such an embodiment, the output conductor 496 and the die contact 433 may be formed from a single patterned portion of layer 561. In another embodiment, the output conductor 496 is formed from a higher conductive layer (e.g., one of layers 557-560), and is electrically connected through conductive vias (e.g., vias 494, 495) and portions of intervening conductive layers to the die contact 432 and the drain bondpad 543. If the output conductor 496 were formed from a portion of conductive layer 560, for example, then the output conductor 496 and trace 485 may be formed from a single patterned portion of layer 560, and the output conductor 496 may be coupled through via 494 to die contact 433.

As with the input side of device 200, in some embodiments, the die contacts 431, 433 that are connected to the drain bondpads 542, 543 of the dies 440, 441 may extend beyond the ends of the drain bondpads 542, 543 to enable additional conductive vias 422 within substrate 210 to be directly connected to the die contacts 431, 433 (and thus closely connected to the drain bondpads 542, 543). Through additional patterned portions of the overlying conductive layers (e.g., portions 423) and additional conductive vias, these additional conductive vias 422 may be electrically connected to interconnects 240 and/or various other circuits integrated within the device 200 (e.g., bias circuits, harmonic frequency termination circuits, control circuits, and so on).

Along those lines, and although not shown in FIGS. 4A-C, 5A, and 5B, some conductive interconnects 240 may be used to receive bias voltages, which may be conducted from the interconnects 240 to the power transistor dies 440, 441 through the patterned conductive layers 556-561 and conductive vias of the substrate 210 (e.g., vias 420, 422). In addition, other conductive interconnects 240 may be used to provide a ground reference (e.g., those interconnects 240 may be coupled to ground when device 200 is incorporated into a larger system). The connections between the ground interconnects 240 and other circuit components (e.g., some of surface mount devices 513-515) may be made through the patterned conductive layers 556-561 and conductive vias of the substrate 210. Still other conductive interconnects 240 may be used to convey control signals to components within device 200.

Accordingly, the power amplifier device 200 illustrated in FIGS. 2A-B, 4A-C, and 5A-B may encompass a full Doherty amplifier circuit in a compact package. It may be noted that no wirebond arrays are used to interconnect the components of the Doherty amplifier. Therefore, in comparison with conventional Doherty amplifier circuits, the lack of wirebond arrays may result in increased amplifier power and efficiency. In addition, the elongated contacts 430-433 coupled to the gate and drain bondpads 540-543 facilitate even power distribution across those connections. Further, minimized inductances inherent in the Doherty device embodiments described herein may enable compliance with higher band specifications.

Figure 6:
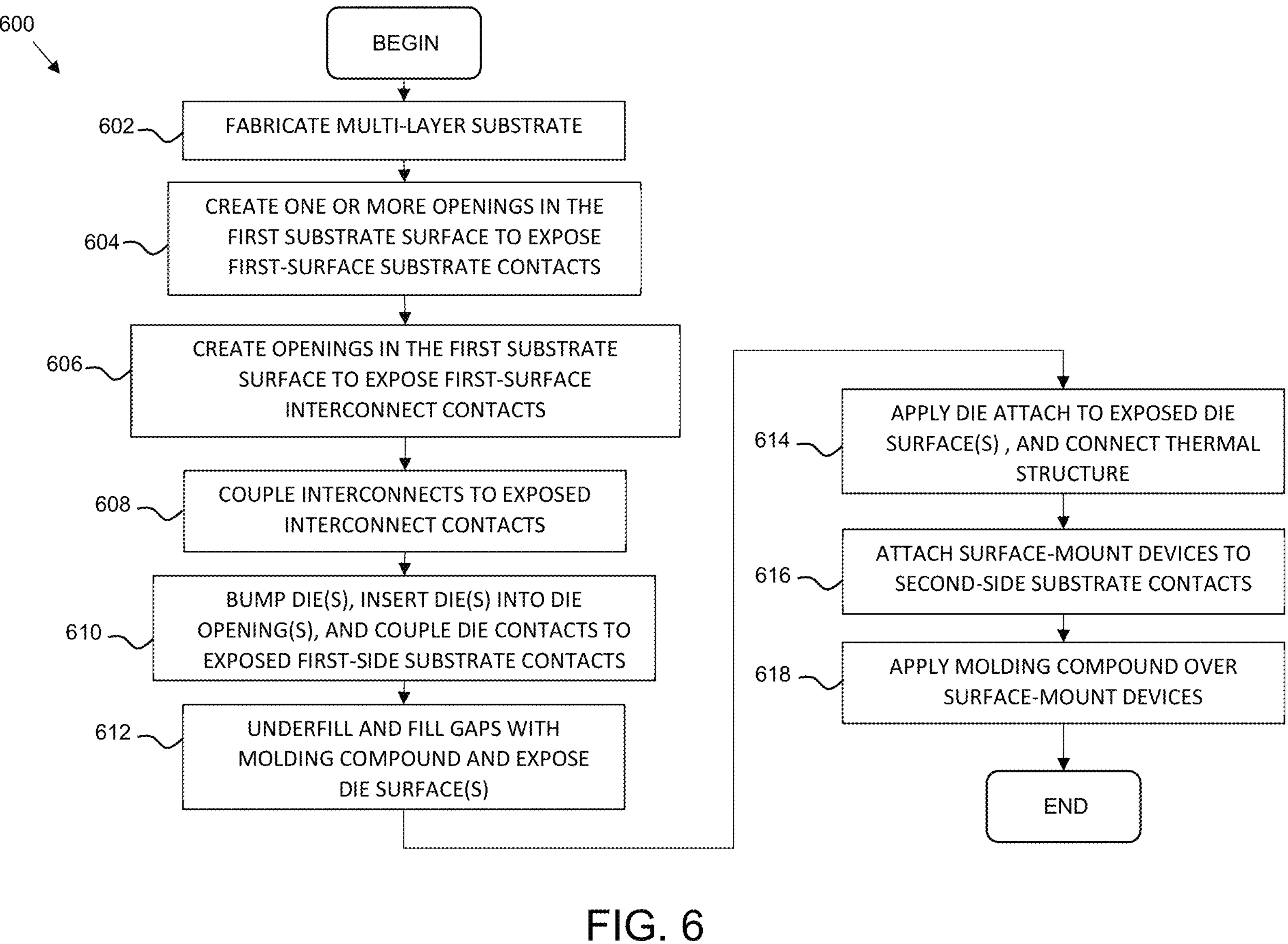
FIG. 6 is a flowchart of a method of manufacturing the power amplifier device of FIGS. 2 and 3, according to an example embodiment.

FIG. 6 is a flowchart of a method 600 of manufacturing the power amplifier device 200 of FIGS. 2A-B, 4A-C, and 5A-B, according to an example embodiment. For enhanced understanding, FIG. 6 should be viewed simultaneously with FIGS. 7-12, which are side, cross-sectional views of the power amplifier device of FIGS. 2A-B and 4A-C through bisection line 5A or 5B (as indicated below) at various stages of manufacture, according to an embodiment.

Figure 7:
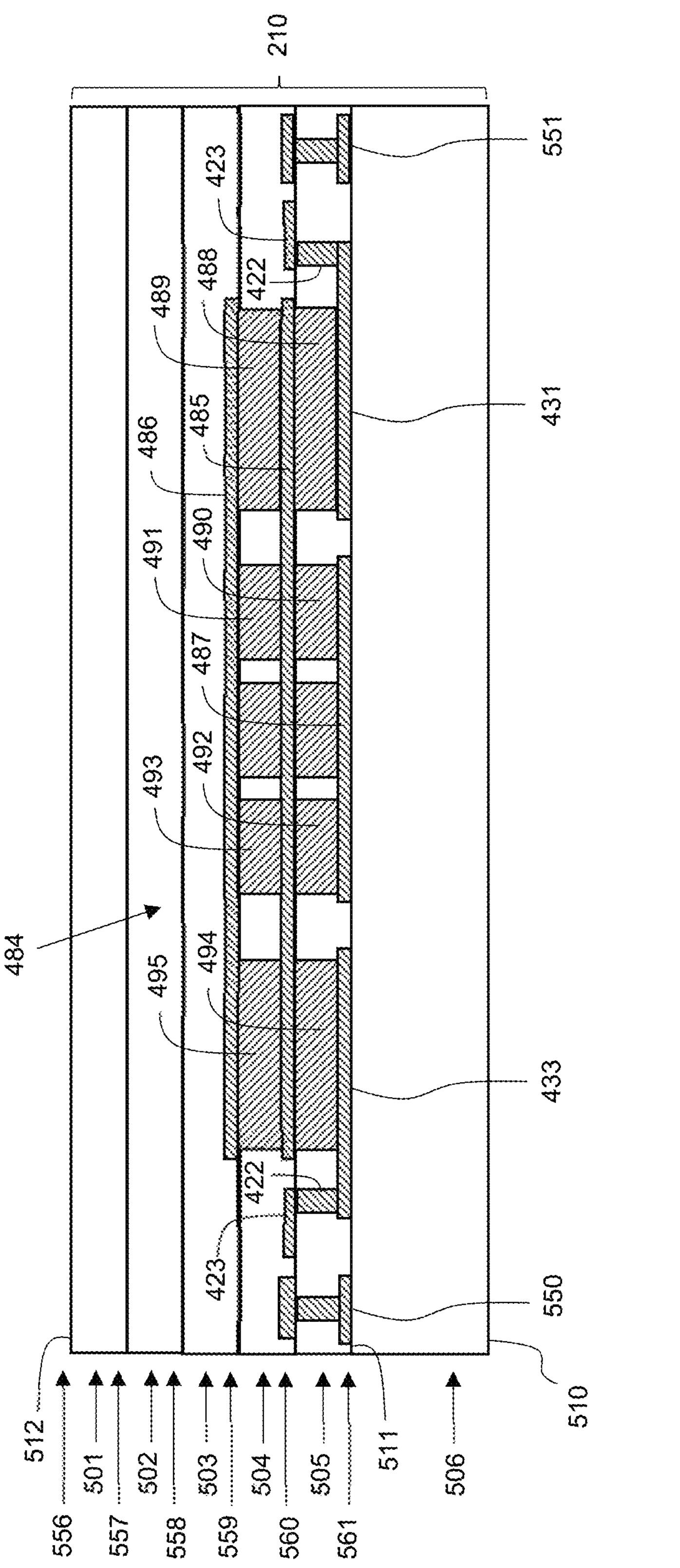
FIGS. 7-12 are side, cross-sectional views of the power amplifier device of FIGS. 2 and 4A at various stages of manufacture, according to an embodiment.

Referring also to FIG. 7, which is a cross-section of substrate 210 through bisection line 5B, the method begins, in step 602, by fabricating a multi-layer substrate 210. The substrate 210 is formed from a stack of multiple dielectric layers 501-506 and multiple patterned conductive layers 556-561, which are built up in an alternating arrangement. The substrate 210 is defined by a lower surface 510, an upper surface 512, and sidewalls extending between the lower and upper surfaces 510, 512. For example, the dielectric layers 501-506 may be formed from PCB dielectric materials (e.g., FR-4), ceramic, or other suitable dielectric materials. The patterned conductive layers 556-561 are formed from conductive metals, which are patterned during the build-up process. Also during the build-up process, conductive vias (e.g., vias 411, 413, 420, 422, 488-495, 516, FIG. 4A-C, 5A-B) are formed through the dielectric layers in order to connect various portions of adjacent patterned conductive layers.

Various conductive paths within the substrate 210 (formed from various combinations of conductive layer portions and conductive vias) will provide for interconnections between dies and components, which will later be mounted to the substrate 210. In addition, some of the conductive paths within the substrate may be configured to provide desired inductances and impedance transformations. For example, a conductive path comprising vias 488-495 and conductive traces 485-487 may form a phase delay and impedance inverter element (e.g., impedance inverter/phase delay structure 484, 184, FIGS. 1, 4A-C, 5B).

It should be noted that, although substrate 210 is shown to include six dielectric layers 501-506 and six conductive layers 556-561, other embodiments of a substrate may include more or fewer dielectric layers and/or conductive layers.

Once completed, the substrate 210 includes substrate contacts 520 (FIGS. 5A and 12), which are exposed at the upper surface 512 of the substrate 210. In addition, the substrate includes embedded substrate die contacts 430-433 and embedded interconnect contacts 450, 451 at an internal, surface 411 of the substrate 210.

Figure 8:
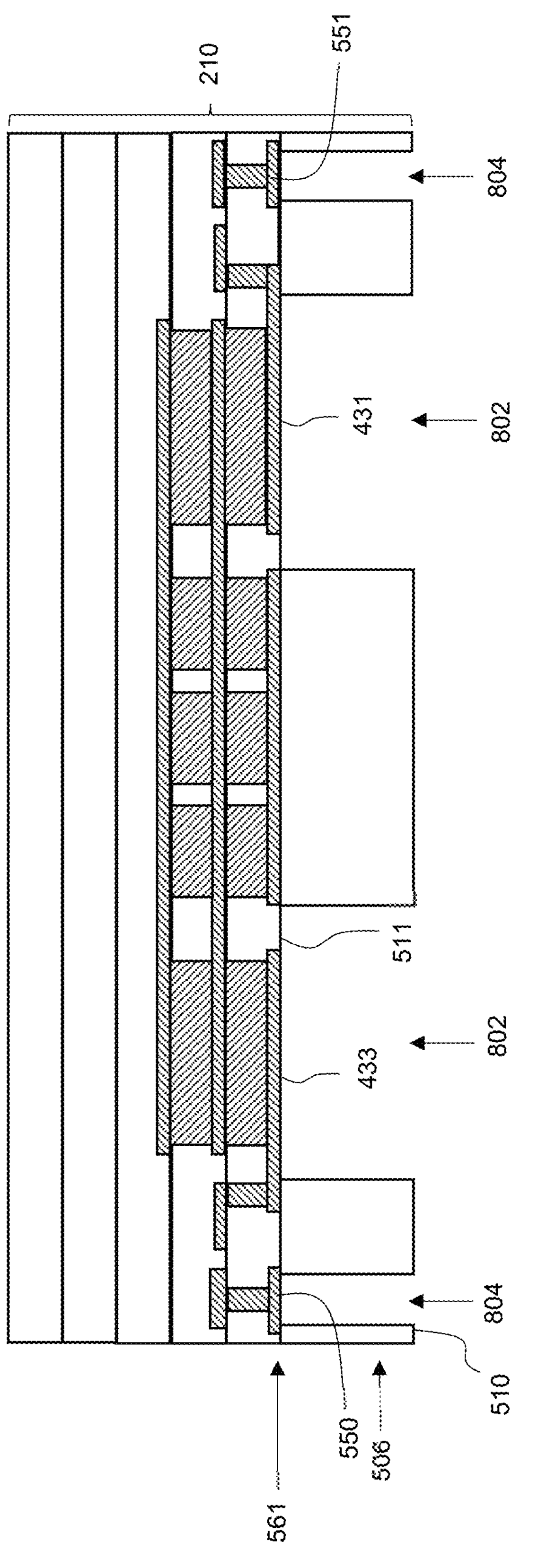

Referring now to FIG. 8 (also a cross-section of substrate 210 through bisection line 5B), the method continues, in step 604, by creating one or more first die openings 802 through the lower substrate surface 510 to expose substrate die contacts 430-433 at the interior surface 511 of the substrate 210. Additionally, in step 606, second interconnect openings 804 are formed through the lower substrate surface 510 to expose interconnect contacts 550, 551, which also may be located at the interior surface 511. According to an embodiment, the openings 802, 804 may be formed using an etching process, which is timed to stop when the substrate and interconnect contacts 430-433, 550, 551 are reached.

Although FIG. 8 illustrates that two die openings 802 are formed in substrate 210, in alternate embodiments, a single opening may be formed, which will accommodate both power transistor dies 440, 441. In addition, although one embodiment for forming interconnect openings 804 may form a separate opening for each interconnect 240, other embodiments may include forming a larger opening that spans multiple interconnect contacts, and into which multiple interconnects 240 may be inserted.

Figure 9:
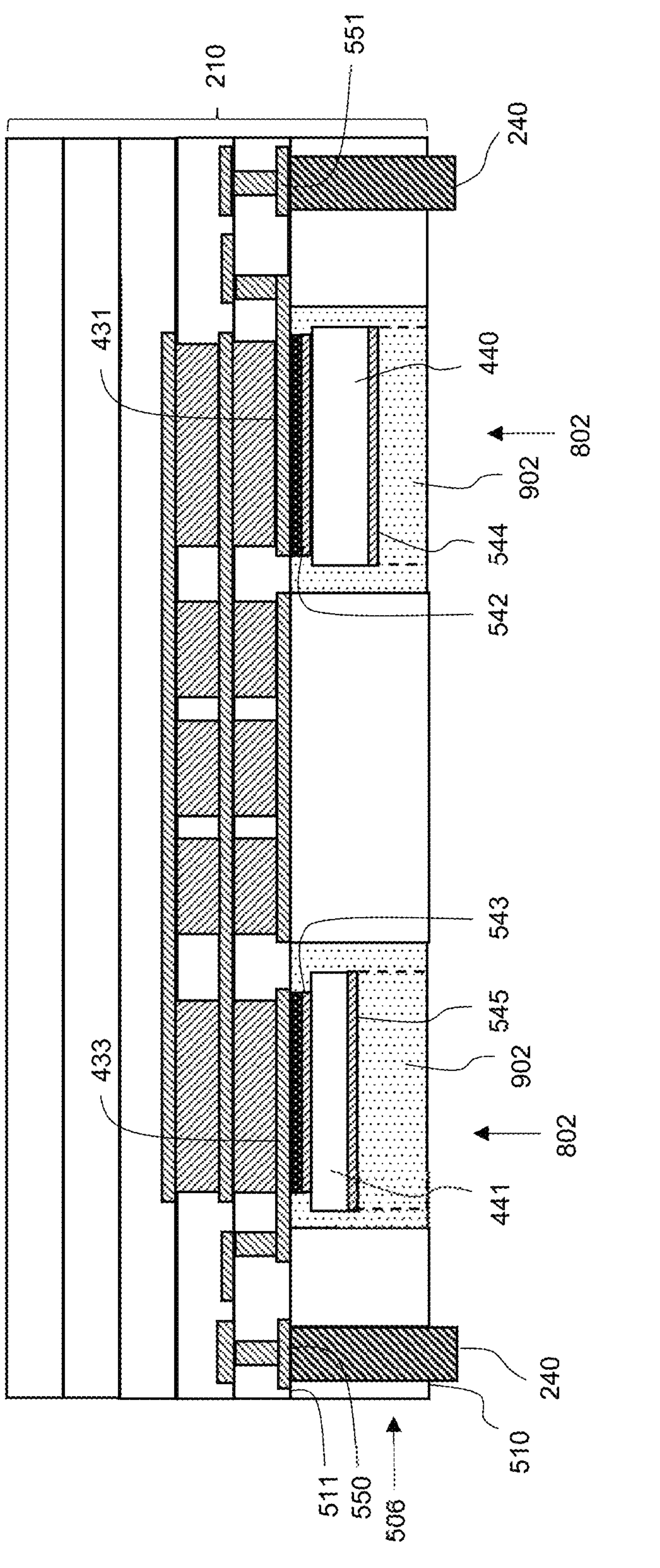

Referring now to FIG. 9, in step 608, conductive interconnects 240 are physically and electrically coupled to the interconnect contacts 550, 551 exposed through the interconnect openings 804. In one embodiment, the conductive interconnects 240 are conductive posts that are inserted into the interconnect openings 804, and then soldered, brazed, or otherwise attached to the interconnect contacts 550, 551. In other embodiments, the conductive interconnects 240 may be formed by filling the interconnect openings 804 with conductive material. In still other embodiments, the interconnects 240 may be portions of a leadframe (not shown). In still other embodiments, multiple interconnects 240 may be packaged side-by-side in one or more separate dielectric interposer structures (not shown), and the dielectric interposer structures may be inserted into larger interconnect openings that span multiple interconnect contacts 550, 551. As shown in FIG. 2B, the interconnect openings and the interconnect contacts 240 may be located adjacent to multiple sides of the device 200 (e.g., to all four sides, as shown, or to less than all four sides).

In step 610, the power transistor dies 440, 441 are "bumped," by applying solder paste to the die bondpads (e.g., to the input and output, or gate and drain, bondpads). The dies are then inserted into the die openings 802. The die bondpads and the solder paste on the die bondpads are brought into contact with corresponding substrate die contacts 430-433. A solder reflow process may then be performed to solder-attach the die bondpads to the substrate die contacts 430-433.

In step 612, gaps between the power transistor dies 440, 441 and sidewalls of the die openings 802 are then filled in with underfill material 902 (e.g., plastic encapsulant material). In some embodiments, the underfill material 902 may be deposited so that it only extends part-way up the sides of the dies 440, 441, leaving the outer surface of the die (e.g., conductive layer 544, 545) exposed. In other embodiments, as indicated in FIG. 9, a sufficient quantity of the underfill material 902 may be deposited in the openings 802 so that the underfill material 902 completely covers the power transistor dies 440, 441. In such an embodiment, portions of the underfill material 902 subsequently may be removed, as indicated by dashed lines in the underfill material 902, to expose the conductive layers 544, 545 on the outward facing surface of the power transistor dies 440, 441. As discussed previously, the conductive layers 544, 545 that define the exposed outer surfaces of the dies 440, 441 may be electrically connected, within each die 440, 441, to a source terminal of a transistor embedded within the die 440, 441.

Figure 10:
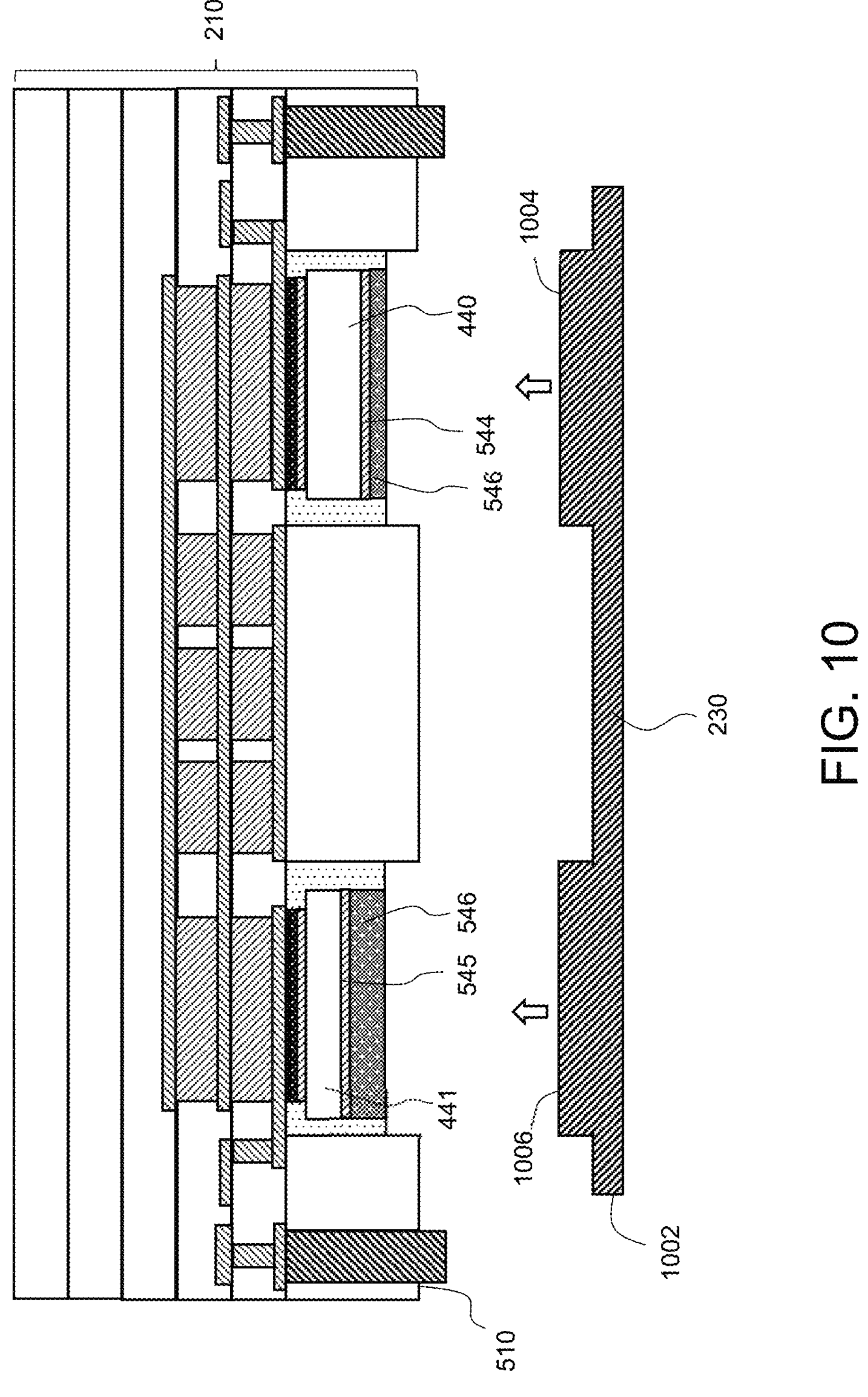
Figure 11:
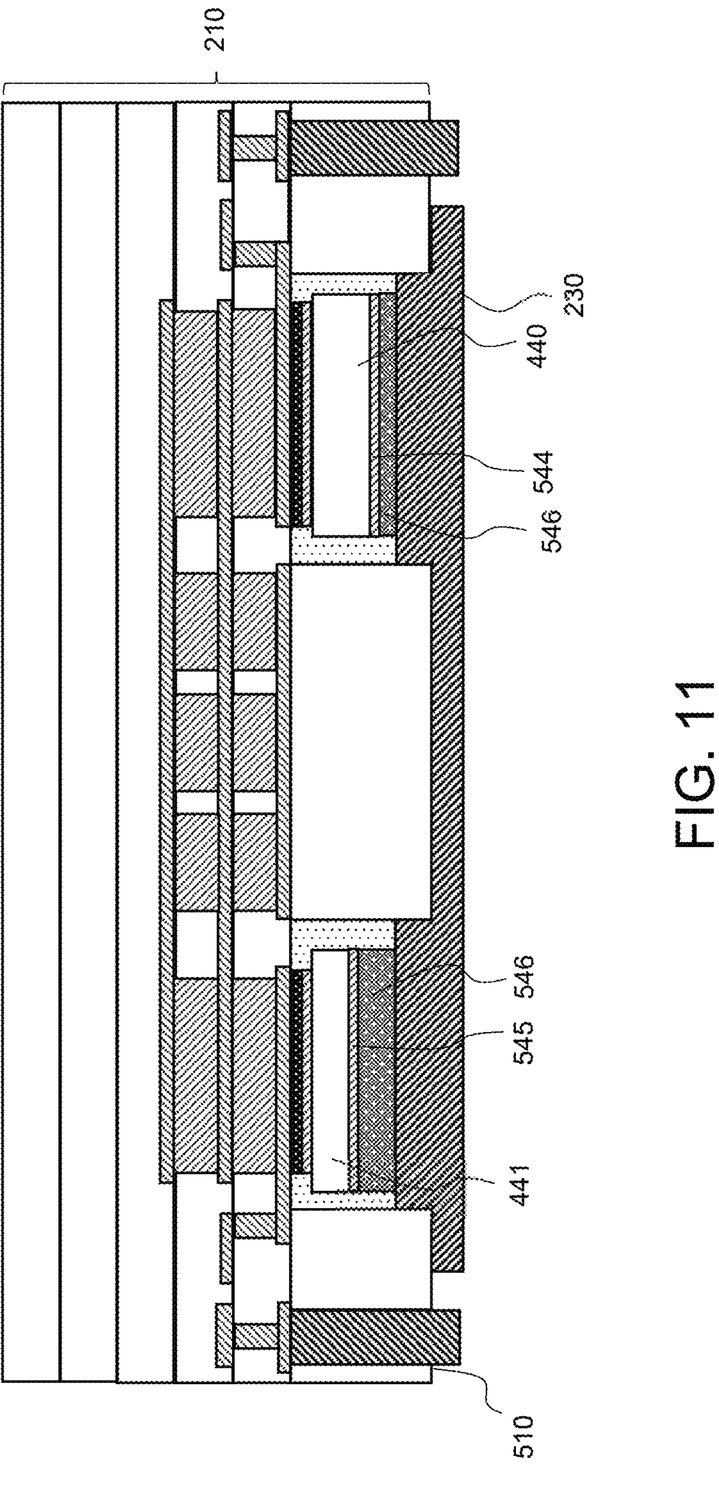

Referring now to FIGS. 10 and 11 and step 614, electrically and thermally conductive die attach material 546 (e.g., solder paste, sinter paste, or other suitable materials) is applied to the outward facing surfaces of the dies 440, 441, and more particularly to the conductive layers 544, 545 of the dies 440, 441. As indicated previously, the thickness of the die attach material 546 over each die 440, 441 may be different to account for differing heights of the dies 440, 441. Alternatively, the thickness of the die attach material 546 over each die 440, 441 may be the same, and height differences may be accommodated by customizing the subsequently attached thermal structure 230.

The thermal structure 230 may be a simple conductive coin, or as illustrated in FIGS. 10 and 11, may have a more complicated configuration. For example, the thermal structure 230 may be a cast or machined piece of thermally conductive material (e.g., metal), which has a base 1002 and multiple pedestals 1004, 1006 that establish equal or differing thicknesses across the thermal structure 230. In the illustrated embodiment, the pedestals 1004, 1006 have equal heights (vertical dimension in FIGS. 10, 11). In other embodiments, the multiple pedestals 1004, 1006 may have different heights. This may be desirable, for example, so that equal thickness of die attach material 546 may be deposited on each die 440, 441, and the die height variation may be accommodated by the different-height pedestals.

The thermal structure 230 is then inserted into the die openings 802 and brought into contact with the die attach material 546. The device 200 is then processed (e.g., by performing a reflow or sintering process) to securely connect the thermal structure 230 to the dies 440, 441.

Figure 12:
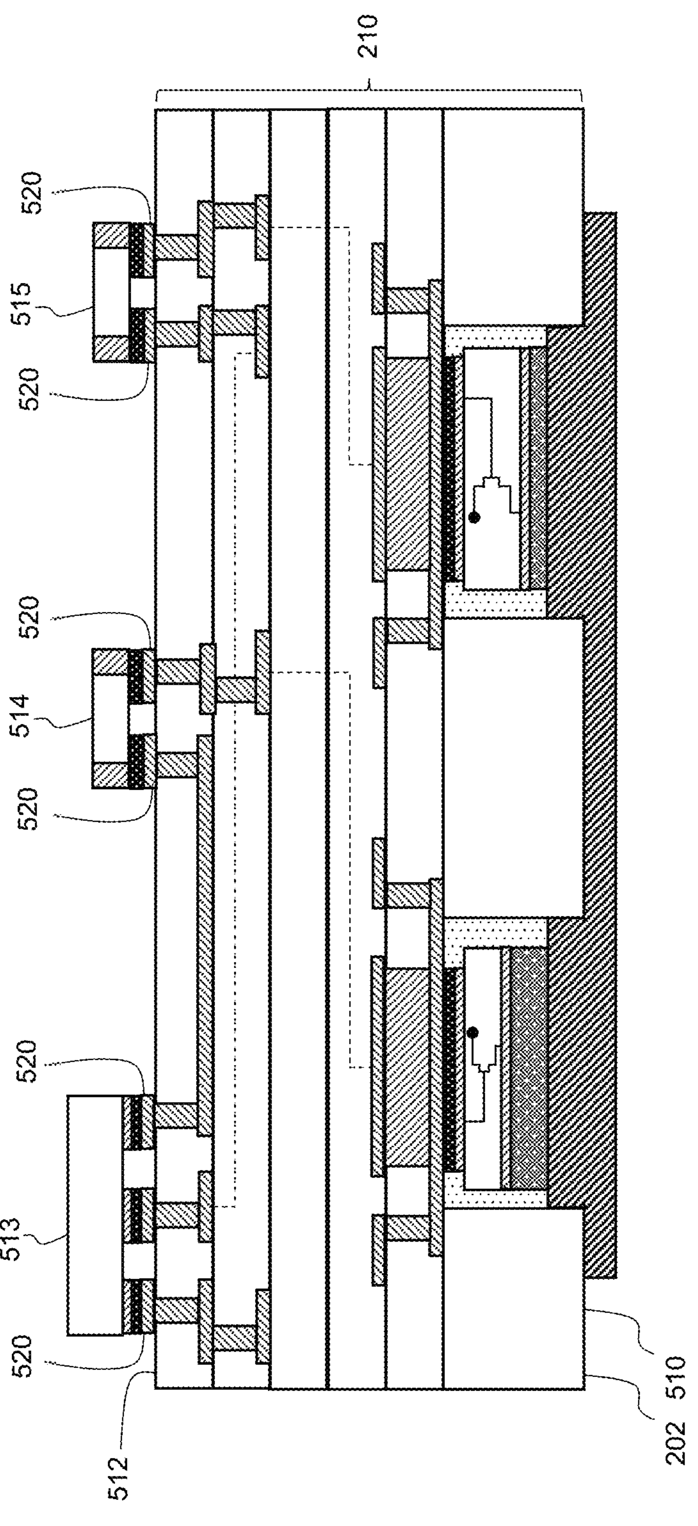

Referring now to FIG. 12 (a cross-section of substrate 210 through bisection line 5A), in step 616, the terminals of one or more surface mount components 513-515 are coupled (e.g., solder-attached) to the additional substrate contacts 520 that are exposed at substrate surface 512. As discussed previously, the surface mount components 513-515 can correspond to a number of components of an amplifier circuit (e.g., pre-amplifier transistors, power splitting circuitry, harmonic termination circuitry, inductors, capacitors, and impedance matching circuitry). For example, surface mount component 513 may correspond to a power divider circuit (e.g., power divider 106, FIG. 1), and surface mount components 514, 515 may correspond to capacitors, inductors, or other circuit elements associated with impedance matching, harmonic termination, and so on. Portions of the patterned conductive layers 556-561 also may correspond to circuit elements associated with the impedance matching and harmonic termination circuits. For example, various conductive traces and vias of layers 556-561 may provide inductances of the impedance matching and harmonic termination circuits. In addition, conductive stubs (e.g., radial stubs) also may be formed from patterned portions of layers 556-561. These conductive stubs can be configured to match a load impedance to the transmission line characteristic impedance. For example, within the conductive layers 556-561, one or more stubs may be positioned along conductive paths at various locations. Each stub may be made capacitive or inductive according to whether the conductive path to which it is coupled presents an inductive or capacitive impedance, respectively.

Referring again to FIGS. 5A-B, the device 200 is completed in step 618 by applying an encapsulation material layer 260 (e.g., molding compound) over substrate surface 512 and the surface-mount components 513-515 coupled to substrate surface 512. The encapsulation material layer 260 defines the upper surface 201 of the device 200, whereas the lower substrate surface 510 and the thermal structure 230 define the lower surface 202 of the device 200.

Figure 13:
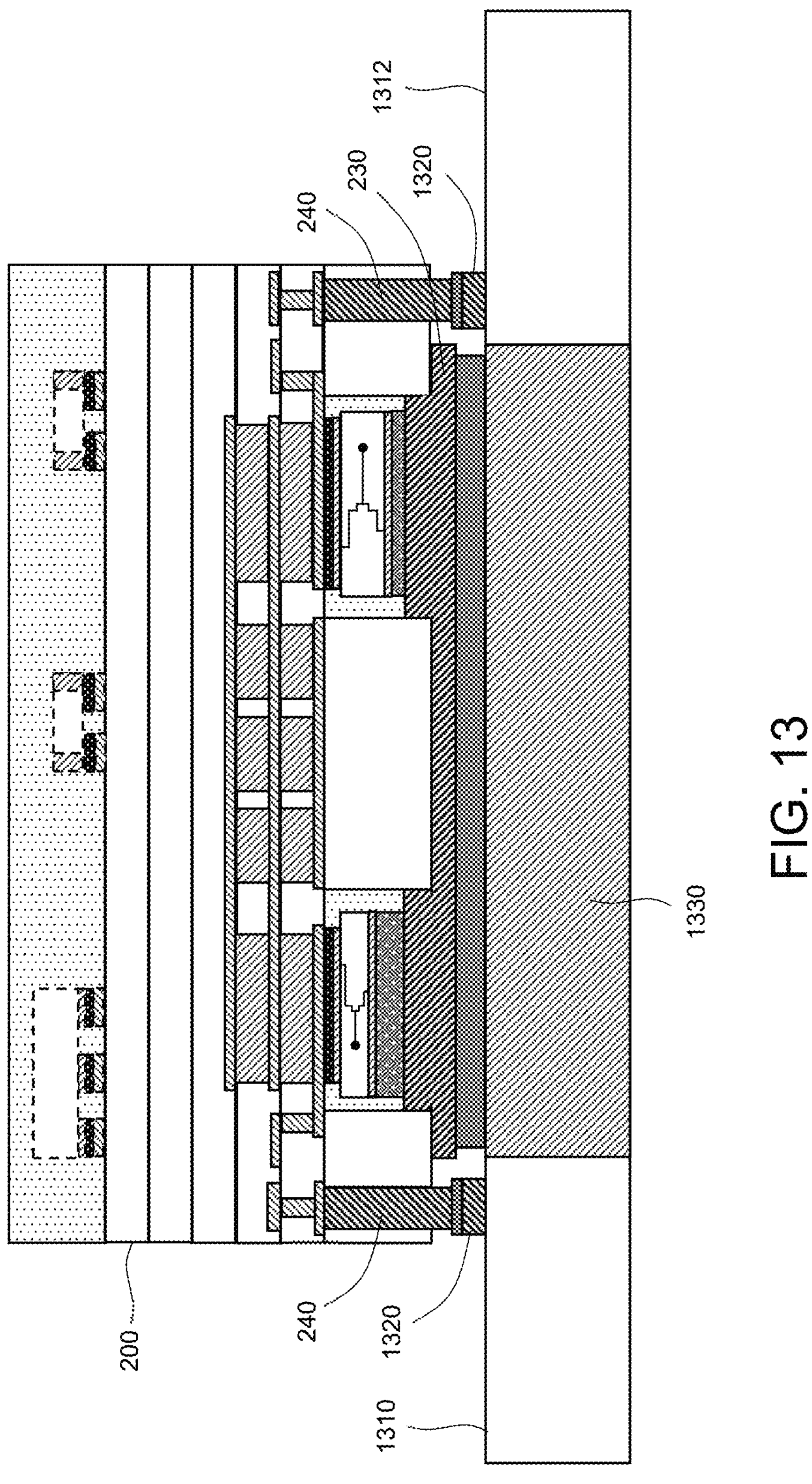
FIG. 13 is a side, cross-sectional view of the power amplifier device of FIGS. 2, 4A-C, and 5A-B coupled to a system substrate with bottom-side heat extraction, according to an example embodiment.

The power amplifier device 200 may then be incorporated into a larger system (e.g., a transmitter and/or communication system). For example, FIG. 13 is side, cross-sectional view of the power amplifier device 200 of FIG. 5B coupled to a system substrate 1310, according to an example embodiment. The system substrate 1310 may be, for example, a PCB with a plurality of contact pads 1320 at a top surface 1312. Although not shown in FIG. 13, the contact pads 1320 may be electrically coupled through additional traces on the substrate 1310 to other system components. According to an embodiment, a heat sink or heat extraction component 1330 (e.g., a conductive coin, thermal vias, or other thermally conductive component) is embedded within the system substrate 1310, and has an exposed upper surface proximate the top surface 1312 of the system substrate 1310.

Device 200 is physically and electrically coupled to the system substrate 1310. More particularly, and according to an embodiment, the thermal structure 230 of device 200 is physically, electrically, and thermally coupled to the heat extraction component 1330 of the system substrate 1310. For example, thermal structure 230 and heat extraction component 1330 may be coupled together using thermal grease, solder, sinter material, or brazing. Besides providing a pathway for extraction of heat, the heat extraction component 1330 also may be coupled to system ground, and thus the heat extraction component 1330 may serve as a system ground connection for device 200.

In addition, the conductive interconnects 240 (including interconnects 240-1, 240-2, FIG. 4A) are physically and electrically coupled (e.g., soldered) to the contact pads 1320 at the top surface 1312 of the system substrate 1310. Accordingly, the system substrate 1310 enables RF input signals to be provided to device 200 through one of the contact pads 1320, RF output signals to be received from device 200 through another one of the contact pads 1320, and additional bias and ground connections to be established between the system substrate 1310 and the device 200 through other contact pads and device interconnects (not shown).

The embodiment of device 200 depicted in FIGS. 4A-C and 5A-B provides for bottom-side cooling of device 200. In a bottom-side cooled system, such as that depicted in FIG. 13, the heat extraction path for the dies 440, 441 within device 200 extends through the system substrate 1310.

If device 200 were slightly modified, it could instead be incorporated into a top-side cooled system. For example, FIG. 14 is a side, cross-sectional view of another embodiment of a power amplifier device 200' (similar to the cross-section of FIG. 5A) coupled to a system substrate 1410 in a system with top-side heat extraction, according to an example embodiment.

Figure 14:
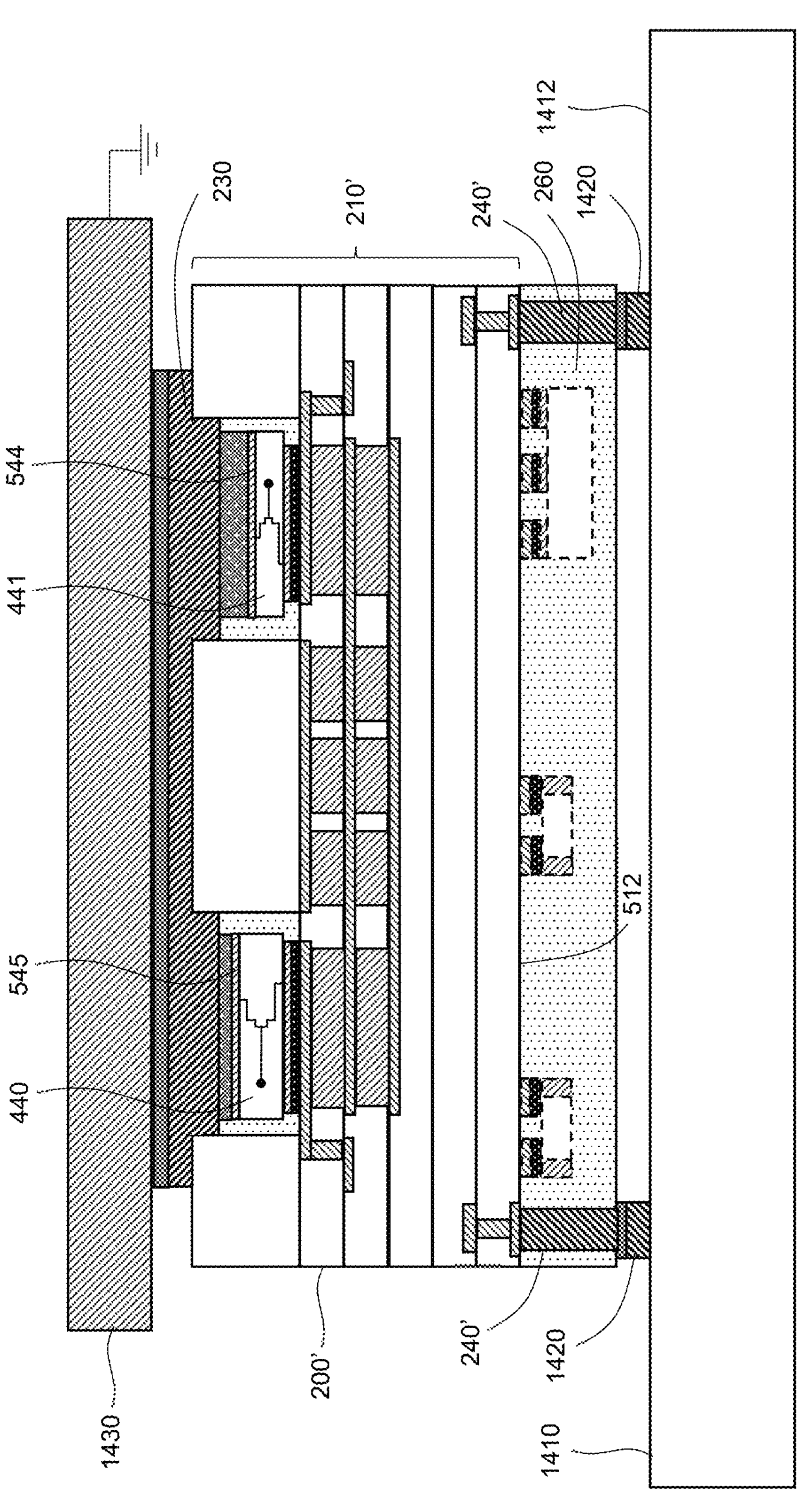
FIG. 14 is a side, cross-sectional view of another embodiment of a power amplifier device coupled to a system substrate with top-side heat extraction, according to an example embodiment.

Device 200' shown in FIG. 14 is slightly different from device 200 in FIGS. 4A-C and 5A-B to facilitate incorporation into a top-side cooled system. In particular, and referring to FIG. 5B, device 200 includes conductive interconnects 240 that extend through though a layer 506 located at the lower surface 510 of the device substrate 210. Thus, the conductive interconnects 240 and the thermal structure 230 both are exposed at the lower surface 510 of the device 200.

In contrast, and referring to FIG. 14, in modified power amplifier device 200', conductive interconnects 240', which function as I/O terminals for the device 200', instead are coupled to surface 512 of device substrate 210', and the interconnects 240' extend through the encapsulation material layer 260 at the opposite surface of the device 200' from the dies 440, 441 and the thermal structure 230. Additional conductive interconnects (not shown) for bias and ground connection also would extend through the encapsulation material layer 260. In other words, in device 200', the conductive interconnects 240' are exposed at an opposite surface of device 200' than the surface at which the thermal structure 230 is exposed. The conductive interconnects 240' are electrically coupled through the device substrate to the various dies 440, 441 and surface mount components 513-515 as discussed above in conjunction with FIGS. 4A-C and 5A-B.

Again, the system substrate 1410 may be, for example, a PCB with a plurality of contact pads 1420 at a top surface 1412. Although not shown in FIG. 14, the contact pads 1420 may be electrically coupled through additional traces on the substrate 1410 to other system components.

Device 200' is physically and electrically coupled to the system substrate 1410. More particularly, and according to an embodiment, the conductive interconnects 240' (and other interconnect, not shown) are physically and electrically coupled (e.g., soldered) to the contact pads 1420 at the top surface 1412 of the system substrate 1410. Accordingly, the system substrate 1410 enables RF input signals to be provided to device 200' through one of the contact pads 1420, RF output signals to be received from device 200' through another one of the contact pads 1420, and additional bias and ground connections to be established between the system substrate 1210 and the device 200' through still other contact pads and device interconnects (not shown).

In the orientation shown in FIG. 14, the thermal structure 230 of device 200' is facing upward away from the system substrate 1410. According to an embodiment, a heat extraction component 1430 (e.g., a heat sink or conductive plate) is physically, electrically, and thermally coupled to the thermal structure 230 of device 200'. For example, thermal structure 230 and heat extraction component 1430 may be coupled together using thermal grease, solder, sinter material, or brazing. Besides providing a pathway for extraction of heat, the heat extraction component 1430 also may be coupled to system ground, and thus the heat extraction component 1430 may serve as a system ground connection for device 200'. In other embodiments, to ensure adequate RF grounding, other grounding structures may be implemented within device 200' (e.g., by providing a conductive pathway through the substrate 210' between conductive layers 544, 545 and a device terminal 240' coupled to system ground), or on the exterior surface of device 200' (e.g., by providing a conductive pathway extending along the sides of substrate 210 and layer 260 that electrically couples layers 544, 545 to a ground contact on the system substrate 1410).

Various modifications may be made to the power transistor devices 200, 200' while maintaining their function and unique aspects. For example, as will be discussed in conjunction with FIG. 15, rather than inserting the power transistor dies 440, 441 into openings in a substrate (e.g., openings 802 in substrate 210, FIG. 8), the power transistor dies 440, 441 instead could be coupled to a substrate surface and encapsulated.

Such an embodiment is shown in FIG. 15, which is a side, cross-sectional view (similar to the view in FIG. 5B) of another example embodiment of a power amplifier device 1500. Power amplifier device 1500 is similar in many respects to power amplifier devices 200, 200' (FIGS. 4A-C, 5A-B, and 14), discussed above. Where elements in power amplifier device 1500 are substantially identical to elements in power amplifier devices 200, 200', the same reference numbers will be used, and all details discussed above with respect to such elements apply equally to the same-numbered elements in FIG. 15. For purpose of brevity, all details will not be repeated here.

For power amplifier device 1500, the device body includes first and second encapsulation material layers 260, 1560 connected to opposite surfaces 1512, 1511 of a substrate 1510. The substrate 1510 is formed from a stack of multiple dielectric layers 501-505 and multiple patterned conductive layers 556-561 in an alternating arrangement. A plurality of conductive vias electrically connect the patterned conductive layers 556-561. Elongated substrate die contacts 430-433 (only 431 and 433 shown in FIG. 15) and interconnect contacts 550, 551 are exposed at a first surface 1511 of the substrate 1510, and additional substrate contacts 520 are exposed at a second surface 1512 of the substrate 1510.

According to an embodiment, one or more surface mount components 513-515 are connected to the additional substrate contacts 520 that are exposed at the second surface 1512 of the substrate 1510. A first encapsulation material layer 260 covers the surface mount components 513-515 and the second substrate surface 1512. The first encapsulation material layer 260 essentially defines the upper device surface 1501.

The surface mount components 513-515 can correspond to a number of components of an amplifier circuit. For example, at least one surface mount component 513 may correspond to a power divider circuit (e.g., power divider 106, FIG. 1), and additional surface mount components 514, 515 may correspond to portions of input impedance matching circuits (e.g., circuits 113, 114, FIG. 1) and/or harmonic termination circuits (e.g., circuits 116, 118, FIG. 1).

According to an embodiment, first and second power transistor dies 440, 441 are connected to the substrate die contacts 430-433, and thus are connected to the first substrate surface 1511. The first power transistor die 440 includes at least one integrated transistor, and the second power transistor die 441 includes at least one additional integrated transistor. Each power transistor includes a gate terminal, a drain terminal, and a source terminal. As previously discussed, the gate and drain terminals of each transistor are coupled to gate and drain contacts (not numbered) that are exposed at first surfaces of the dies 440, 441. The gate and drain contacts, in turn, are coupled to (e.g., soldered to) the substrate die contacts 430-433. The source terminal of each transistor is coupled to a conductive bottom layer 544, 545 of each die 440, 441, and the conductive bottom layer 544, 545 defines a second die surface of each die 440, 441.

In addition to the power transistor dies 440, 441, the proximal ends of a plurality of conductive interconnects 1540 (e.g., analogous to interconnects 240, FIG. 2) are coupled to interconnect contacts 550, 551 at the first surface 1511 of the substrate. Similar to the conductive interconnects 240 of FIGS. 4A-C and 5A-B, the conductive interconnects 1540 of the power transistor device 1500 are configured to convey RF signals, bias voltages, and ground connections to the amplifier circuitry (e.g., dies 440, 441 and surface mount components 513-515) embedded within the device 1500. As described previously, one conductive interconnect 1340 more specifically corresponds to an RF input terminal (e.g., terminal 102, FIG. 1), and another conductive interconnect 1340 more specifically corresponds to an RF output terminal (e.g., output terminal 104, FIG. 1).

In contrast with device 200 of FIGS. 4A-C and 5A-B, in which dies 440, 441 and interconnects 240 are inserted into openings 802 in a substrate layer 506 (FIGS. 4A-C, 5A-B, 8), power transistor device 1500 includes a second encapsulation material layer 1560 that covers the first surface 1511, sidewalls of the power transistor dies 440, 441 and sidewalls of the conductive interconnects 1540. The second encapsulation material layer 1560 essentially defines the lower device surface 1502. According to an embodiment, the conductive layers 544, 545 of the power transistor dies 440, 441 are exposed at the lower device surface 1502, as are the distal ends of the conductive interconnects 1540.

When an input RF signal is provided to the input RF interconnect 1440, the input RF signal may be conveyed through the substrate 1510 to the input terminal of the power divider circuit 513, and the power divider circuit 513 may perform the function of splitting the input RF signal into multiple (e.g., two or more) separate signals (e.g., a carrier signal and a peaking signal). The separate signals provided at the power divider outputs may then be conveyed through the substrate 1510 to the impedance matching components 514, 515 or directly to the inputs of the power transistor dies 440, 441.

Although not shown in the cross-section of FIG. 14, other conductive interconnects may be used to receive bias voltages, which may be conducted from the interconnects to the power transistor dies 440, 441 through the patterned conductive layers 556-561 and conductive vias of the substrate 1510. In addition, other conductive interconnects may be used to provide a ground reference (e.g., they may be coupled to ground when device 1500 is incorporated into a larger system). The ground connection between the ground interconnects and other circuit components (e.g., some of surface mount devices 513-515) may be made through the patterned conductive layers 556-561 and conductive vias of the substrate 1510.

The power amplifier device 1500 may be incorporated into a larger system (e.g., a transmitter and/or communication system) in a similar manner as the power amplifier device 200 of FIGS. 4A-C and 5A-B (e.g., as shown in FIG. 13). As with device 200, the embodiment of device 1500 depicted in FIG. 15 provides for bottom-side cooling of device 1500. In a bottom-side cooled system, as discussed previously, the heat extraction path for the dies 440, 441 within device 1500 extends through a system substrate coupled to the bottom surface 1502 of the device 1500.

Alternatively, device 1500 may be slightly modified as discussed in conjunction with device 200' of FIG. 13, to configure the device to be incorporated into a top-side cooled system. For example, the conductive interconnects 1540 could be coupled to surface 1512 and extend through layer 260, in an alternate embodiment, rather than being coupled to surface 1511. In such an embodiment, the conductive interconnects would be exposed at the upper surface 1501 of the device.

Such a device could be physically and electrically coupled to a system substrate by connecting (e.g., soldering), the conductive interconnects to contact pads at the top surface of the system substrate. Further, a heat extraction component (e.g., a heat sink or conductive plate) could be physically, electrically, and thermally coupled to the conductive layers 544, 545 of dies 440, 441 in a manner similar to that shown in FIG. 14.

The above-described embodiments of power amplifier devices 200, 200', 1500 each have I/O and other terminals (e.g., conductive interconnects 240, 240-1, 240-2, 240', 1540) that are exposed at an upper or lower surface of the device. In some cases, it may be desirable to have I/O and other terminals that extend from the side of a device, so that a lower portion of the device may be nested into an opening in a system substrate (e.g., a system PCB). Nesting a device in a system substrate in this manner enables bottom-side cooling easily to be implemented.

Figure 16:
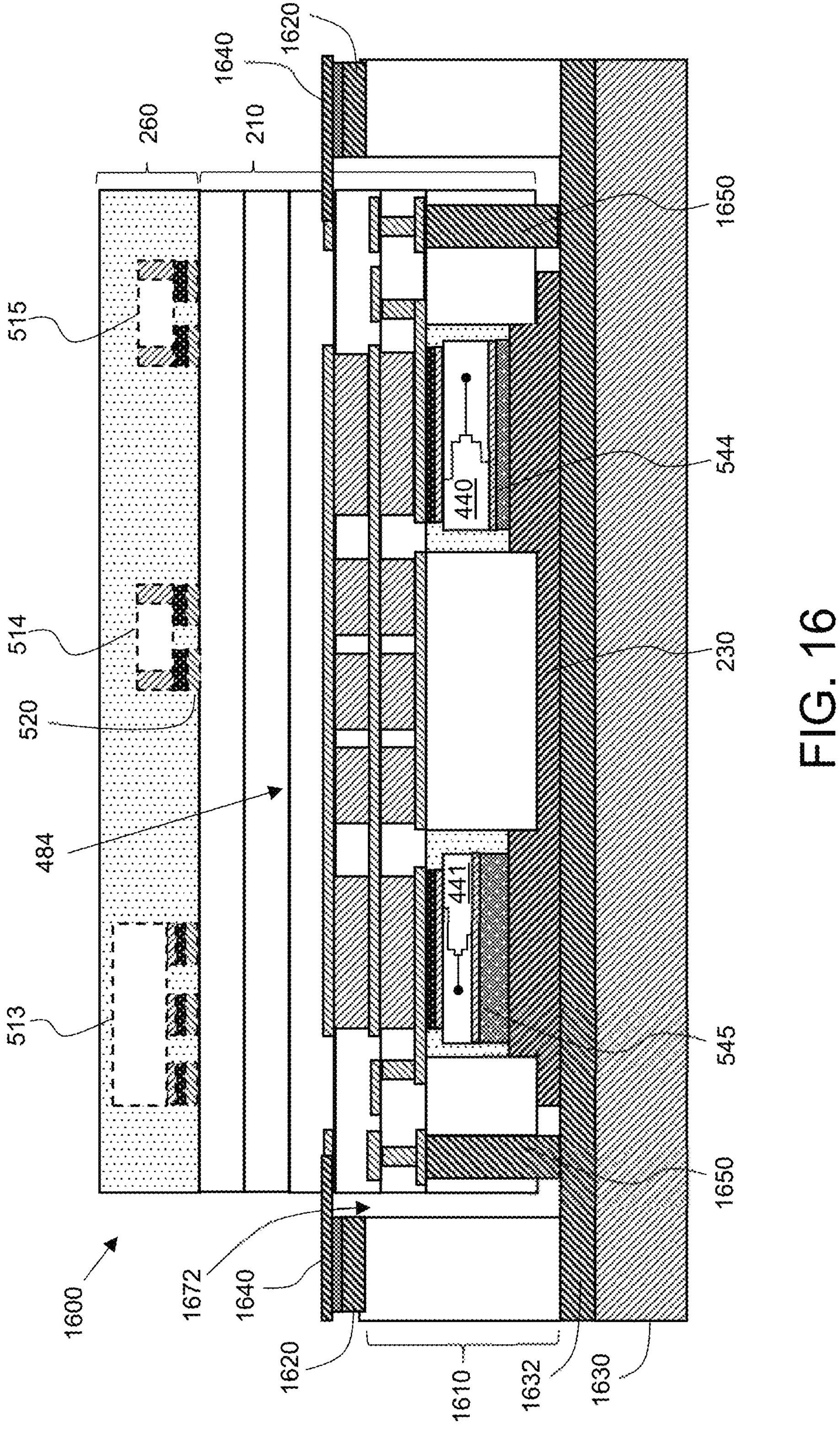
FIG. 16 is a side, cross-sectional view of yet another embodiment of a power amplifier device with side terminals, according to an example embodiment.

FIG. 16 is side, cross-sectional view of yet another embodiment of a power amplifier device 1600 with side terminals 1640 coupled to a system substrate 1610, according to an example embodiment. Power amplifier device 1600 is similar in many respects to power amplifier device 200 (FIGS. 4A-C, 5A-B), discussed above, except that various terminals of device 1600 extend from the sides of the device, rather than being exposed at the lower surface of the device. Where elements in power amplifier device 1600 are substantially identical to elements in power amplifier device 200, the same reference numbers will be used, and all details discussed above with respect to such elements apply equally to the same-numbered elements in FIG. 16. For purpose of brevity, all details will not be repeated here.

Portions of power amplifier device 1600 that are substantially the same as corresponding portions of power amplifier device 200 include device substrate 210, power transistor dies 440, 441 that are embedded in openings (e.g., openings 802, FIG. 8) in the device substrate 210, elongated contacts 430-433, elongated bondpads 541-543, input traces 410, 412, impedance inverter/phase delay structure 484, and surface mount components 513-515 that are embedded in encapsulant material layer 260, among other elements.

Device 1600 also may include optional interconnects 1650, which also are embedded in the same side of the device 1600 as the dies 440, 441. These interconnects 1650 are similar to interconnects 240, 240-1, 240-2 (FIGS. 4A-C, 5A-B), in that they are electrically connected through the patterned conductive layers and vias of the substrate 210 to various components and circuits embedded in device 1600. However, unlike interconnects 240, 240-1, 240-2, which function as I/O, ground, and bias terminals, interconnects 1650 only provide for ground connections for the various components and circuits embedded within the device 1600.

In order to provide I/O and bias connections, device 1600 includes a plurality of side leads 1640, which extend perpendicularly from the sides of device 1600, and more particularly from the sides of device substrate 210. The leads 1640 are electrically coupled through the patterned conductive layers and vias of the device substrate 210 to the various dies 440, 441 and surface mount components 513-515.

According to an embodiment, each of the leads 1640 electrically connects to at least one conductive portion of one of the embedded conductive layers (e.g., any of layers 557-561, FIGS. 5A-B) of the device substrate 210. At least one lead 1640 corresponds to the RF input for the amplifier device 1600 (e.g., input 102, FIG. 1), and at least one other lead 1640 corresponds to the RF output for the amplifier device 1600 (e.g., output terminal 104, FIG. 1).

To incorporate the device 1600 into a larger system, a lower half of the device 1600 is inserted into an opening 1672 in a system substrate 1610. Again, the system substrate 1610 may be, for example, a PCB with a plurality of contact pads 1620 at a top surface of the substrate 1610. Although not shown in FIG. 16, the contact pads 1620 may be electrically coupled through additional traces on the substrate 1610 to other system components. A thermal structure 1632 (e.g., a conductive coin or other structure) is brought into contact with the inserted surface of the device 1600 (e.g., thermal structure 230), and is physically and electrically coupled to the device 1600 (e.g., with die attach, thermal grease, or other conductive material). Finally, a heat sink 1630 may be coupled to the thermal structure 1632.

Figure 17:
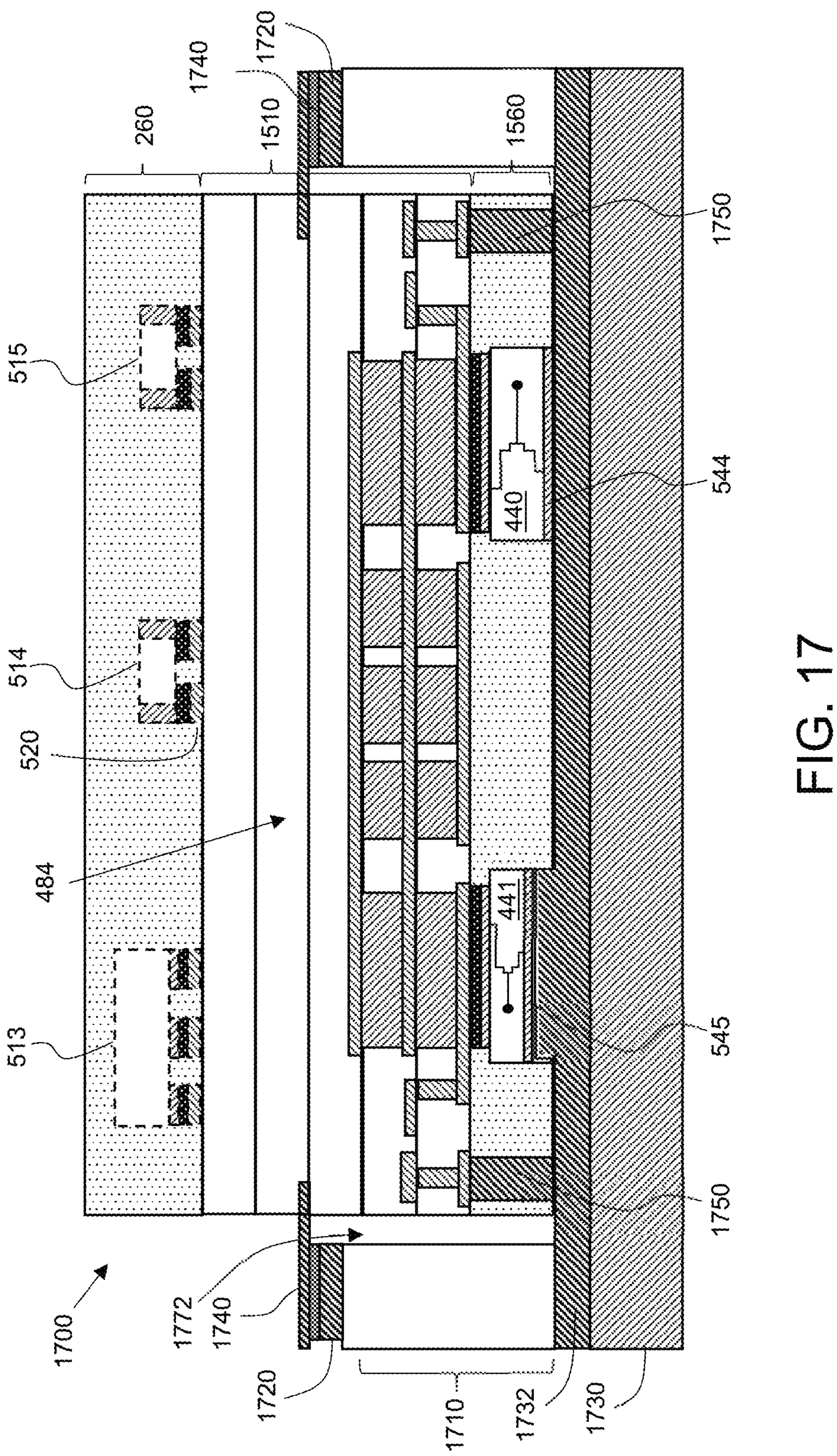
FIG. 17 is a side, cross-sectional view of yet another embodiment of a power amplifier device with side terminals, according to another example embodiment.

FIG. 17 is side, cross-sectional view of yet another embodiment of a power amplifier device 1700 with side terminals 1740 coupled to a system substrate 1710, according to another example embodiment. Power amplifier device 1700 is similar in many respects to power amplifier device 1500 (FIG. 15), discussed above, except that various terminals of device 1700 extend from the sides of the device, rather than being exposed at the lower surface of the device. Where elements in power amplifier device 1700 are substantially identical to elements in power amplifier device 1500, the same reference numbers will be used, and all details discussed above with respect to such elements apply equally to the same-numbered elements in FIG. 17. For purpose of brevity, all details will not be repeated here.

Portions of power amplifier device 1700 that are substantially the same as corresponding portions of power amplifier device 1500 include device substrate 1510, power transistor dies 440, 441 that are embedded in one encapsulant material layer 1560, elongated contacts 430-433, elongated bondpads 541-543, input traces 410, 412, impedance inverter/phase delay structure 484, and surface mount components 513-515 that are embedded in another encapsulant material layer 260, among other elements.

Device 1700 also may include optional interconnects 1750, which also are embedded in the first encapsulant material layer 1560. These interconnects 1750 are similar to interconnects 1540 (FIG. 15), in that they are electrically connected through the patterned conductive layers and vias of the substrate 1510 to various components and circuits embedded in device 1700. However, unlike interconnects 1540, which function as I/O, ground, and bias terminals, interconnects 1750 only provide for ground connections for the various components and circuits embedded within the device 1700.

In order to provide I/O and bias connections, device 1700 includes a plurality of side leads (e.g., leads 1740), which extend perpendicularly from the sides of device 1700, and more particularly from the sides of device substrate 1510. The leads 1740 are electrically coupled through the patterned conductive layers and vias of the device substrate 1510 to the various dies 440, 441 and surface mount components 513-515.

According to an embodiment, each of the leads 1740 electrically connects to at least one conductive portion of one of the embedded conductive layers (e.g., any of layers 557-561, FIG. 15) of the device substrate 1510. At least one lead 1740 corresponds to the RF input for the amplifier device 1700 (e.g., input 102, FIG. 1), and at least one other lead 1740 corresponds to the RF output for the amplifier device 1700 (e.g., output terminal 104, FIG. 1).

To incorporate the device 1700 into a larger system, a lower half of the device 1700 is inserted into an opening 1772 in a system substrate 1710. Again, the system substrate 1710 may be, for example, a PCB with a plurality of contact pads 1720 at a top surface of the substrate 1710. Although not shown in FIG. 17, the contact pads 1720 may be electrically coupled through additional traces on the substrate 1710 to other system components. A thermal structure 1732 (e.g., a conductive coin or other structure) is brought into contact with the inserted surface of the device 1700, and is physically and electrically coupled to the exposed conductive layers 544, 545 of the dies 440, 441 with conductive die attach. Finally, a heat sink 1730 may be coupled to the thermal structure 1732.

An embodiment of a power amplifier device includes first and second power transistor dies and a substrate. The first power transistor die includes a first bondpad and a first integrated transistor. The first bondpad is elongated and exposed at a first surface of the first power transistor die. The first integrated transistor includes a first terminal coupled to the first bondpad. The second power transistor die includes a second bondpad and a second integrated transistor. The second bondpad is elongated and exposed at a first surface of the second power transistor die. The second integrated transistor includes a second terminal coupled to the second bondpad.

The substrate is formed from a stack of multiple dielectric layers and multiple patterned conductive layers in an alternating arrangement, and a plurality of conductive vias electrically coupling portions of the multiple patterned conductive layers. The substrate includes a first die contact that is exposed at a first substrate surface and that is elongated and connected to the first elongated bondpad, a second die contact that is exposed at the first substrate surface and that is elongated and connected to the second elongated bondpad, and a conductive structure connected between the first and second die contacts. The conductive structure is formed from portions of the patterned conductive layers and at least two vias of the plurality of conductive vias.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A power amplifier device for a Doherty power amplifier that includes a first amplifier with a first output, a second amplifier with a second output, an impedance inverter/phase delay structure coupled between the first and second outputs of the first and second amplifiers, and a combining node, the power amplifier device comprising:

a first power transistor die with a first side and a second side that is perpendicular to the first side of the first power transistor die, wherein the first power transistor die includes a first bondpad that is elongated and exposed at a first surface of the first power transistor die, wherein the first bondpad has a first bondpad length that is at least five times greater than a first bondpad width, and the first bondpad length is aligned in parallel with the first side of the first power transistor die, and a first integrated transistor that includes a first terminal coupled to the first bondpad, wherein the first terminal corresponds to the first output of the first amplifier;

a second power transistor die with a first side and a second side that is perpendicular to the first side of the second power transistor die, wherein the second side of the second power transistor die faces the second side of the first power transistor die, and the second power transistor die includes a second bondpad that is elongated and exposed at a first surface of the second power transistor die, wherein the second bondpad has a second bondpad length that is at least five times greater than a second bondpad width, and the second bondpad length is aligned in parallel with the first side of the second power transistor die, wherein the second bondpad is co-located with the combining node of the Doherty power amplifier, and a second integrated transistor that includes a second terminal coupled to the second bondpad, wherein the second terminal corresponds to the second output of the second amplifier; and a substrate formed from a stack of multiple dielectric layers and multiple patterned conductive layers in an alternating arrangement, and a plurality of conductive vias electrically coupling portions of the multiple patterned conductive layers, wherein the substrate includes a first die contact that is exposed at a first substrate surface and that is elongated and connected to the first bondpad across the first bondpad length of the first bondpad, a second die contact that is exposed at the first substrate surface and that is elongated and connected to the second bondpad across the second bondpad length of the second bondpad, and a conductive structure aligned in parallel with the first and second bondpad lengths and connected between the first and second die contacts, wherein the conductive structure is formed from portions of the patterned conductive layers and at least two vias of the plurality of conductive vias, wherein the conductive structure corresponds to the impedance inverter/phase delay element of the Doherty power amplifier with a first end coupled to the first output of the first amplifier, and a second end coupled to the second output of the second amplifier and to the combining node.

2. The power amplifier of claim 1, wherein:

the first bondpad is an output bondpad for the first power transistor die, and the first terminal is a drain terminal of the first integrated transistor; and the second bondpad is an output bondpad for the second power transistor die, and the second terminal is a drain terminal of the second integrated transistor.

3. The power amplifier device of claim 1, wherein the first die contact and the first bondpad are connected together using solder, sintering, or brazing.

4. The power amplifier device of claim 1, wherein the conductive structure comprises:

a first conductive trace formed from a portion of a first patterned conductive layer of the patterned conductive layers and extending between the first and second power transistor dies;

a first via of the plurality of conductive vias connected between the first die contact and the first conductive trace; and a second via of the plurality of conductive vias connected between the second die contact and the first conductive trace.

5. The power amplifier device of claim 4, wherein:

the first via is a first trench via that is elongated; and the second via is a second trench via that is elongated.

6. The power amplifier device of claim 4, wherein the conductive structure further comprises:

a second conductive trace formed from a portion of a second patterned conductive layer of the patterned conductive layers; and one or more additional vias connected between the first conductive trace and the second conductive trace.

7. The power amplifier device of claim 6, wherein:

each of the one or more additional vias is a trench via.

8. The power amplifier device of claim 6, wherein the conductive structure further comprises:

a third conductive trace formed from a portion of a third patterned conductive layer of the patterned conductive layers; and one or more further additional vias connected between the first conductive trace and the third conductive trace.

9. The power amplifier device of claim 1, wherein:

the first power transistor die further includes a third bondpad that is exposed at the first surface of the first power transistor die, wherein the third bondpad is coupled to a second terminal of the first integrated transistor, a first conductive layer at a second surface of the first power transistor die, wherein the first conductive layer is coupled to a third terminal of the first integrated transistor;

the second power transistor die further includes a fourth bondpad that is exposed at the first surface of the second power transistor die, wherein the fourth bondpad is coupled to a second terminal of the second integrated transistor, and a second conductive layer at a second surface of the second power transistor die, wherein the second conductive layer is coupled to a third terminal of the second integrated transistor; and the substrate further includes a third die contact that is exposed at the first substrate surface and that is connected to the third bondpad, and a fourth die contact that is exposed at the first substrate surface and that is connected to the fourth bondpad.

10. The power amplifier device of claim 9, wherein:

the third bondpad and the third die contact are elongated;

a second terminal of the first integrated transistor is coupled to the third bondpad;

the fourth bondpad and the fourth die contact are elongated; and a second terminal of the second integrated transistor is coupled to the fourth bondpad; and the substrate further includes a first patterned conductor formed from a portion of a first patterned conductive layer and having a first edge that is elongated and that overlies the third bondpad;

a first via of the plurality of conductive vias connected between the third bondpad and the first patterned conductor;

a second patterned conductor formed from a portion of the first patterned conductive layer and having a second edge that is elongated and that overlies the fourth bondpad; and a second via of the plurality of conductive vias connected between the fourth bondpad and the second patterned conductor.

11. The power amplifier device of claim 9, wherein:

the first terminal of the first integrated transistor is a first drain terminal;

the second terminal of the first integrated transistor is a first gate terminal;

the third terminal of the first integrated transistor is a first source terminal;

the first terminal of the second integrated transistor is a second drain terminal;

the second terminal of the second integrated transistor is a second gate terminal; and the third terminal of the second integrated transistor is a second source terminal.

12. The power amplifier device of claim 1, further comprising:

a plurality of additional contacts exposed at a second substrate surface;

one or more surface-mount components connected to the plurality of additional components at the second substrate surface, wherein the one or more surface-mount components are electrically coupled through the patterned conductive layers and the conductive vias to the first and second die contacts; and an encapsulation material layer covering the one or more surface-mount components and the second substrate surface, wherein the encapsulation material layer defines a surface of the power amplifier device.

13. The power amplifier device of claim 12, wherein the one or more surface mount components form portions of amplifier circuitry selected from pre-amplifier transistors, power splitting circuitry, harmonic termination circuitry, inductors, capacitors, and impedance matching circuitry.

14. The power amplifier device of claim 1, wherein the substrate further comprises:

first and second interconnect contacts exposed at the first substrate surface;

a first conductive interconnect connected to the first interconnect contact and electrically coupled to the multiple patterned conductive layers and to a control terminal of the first integrated transistor; and a second conductive interconnect connected to the second interconnect contact and electrically coupled to the multiple patterned conductive layers and to a drain terminal of the second integrated transistor.

15. The power amplifier device of claim 1, wherein the substrate further comprises:

first and second interconnect contacts exposed at a second substrate surface;

a first conductive interconnect connected to the first interconnect contact and electrically coupled to the multiple patterned conductive layers and to a control terminal of the first integrated transistor; and a second conductive interconnect connected to the second interconnect contact and electrically coupled to the multiple patterned conductive layers and to a drain terminal of the second integrated transistor.

16. The power amplifier device of claim 1, further comprising:

one or more thermal structures contacting second surfaces of the first and second power transistor dies.

17. The power amplifier device of claim 1, wherein the first and second power transistor dies comprise a carrier amplifier die and a peaking amplifier die of the Doherty power amplifier.

18. An amplifier system comprising:

a system substrate; and a power amplifier device coupled to the system substrate, wherein the power amplifier device forms a portion of a Doherty power amplifier that includes a first amplifier with a first output, a second amplifier with a second output, an impedance inverter/phase delay structure coupled between the first and second outputs of the first and second amplifiers, and a combining node, and wherein the power amplifier device includes a first power transistor die with a first side and a second side that is perpendicular to the first side of the first power transistor die, wherein the first power transistor die includes a first bondpad that is elongated and exposed at a first surface of the first power transistor die, wherein the first bondpad has a first bondpad length that is at least five times greater than a first bondpad width, and the first bondpad length is aligned in parallel with the first side of the first power transistor die, and a first integrated transistor that includes a first terminal coupled to the first bondpad, wherein the first terminal corresponds to the first output of the first amplifier, a second power transistor die with a first side and a second side that is perpendicular to the first side of the second power transistor die, wherein the second side of the second power transistor die faces the second side of the first power transistor die, and the second power transistor die includes a second bondpad that is elongated and exposed at a first surface of the second power transistor die, wherein the second bondpad has a second bondpad length that is at least five times greater than a second bondpad width, and the second bondpad length is aligned in parallel with the first side of the second power transistor die, wherein the second bondpad is co-located with the combining node of the Doherty power amplifier, and a second integrated transistor that includes a second terminal coupled to the second bondpad, wherein the second terminal corresponds to the second output of the second amplifier, and a device substrate formed from a stack of multiple dielectric layers and multiple patterned conductive layers in an alternating arrangement, and a plurality of conductive vias electrically coupling portions of the multiple patterned conductive layers, wherein the device substrate includes a first die contact that is exposed at a first substrate surface and that is elongated and connected to the first bondpad across the first bondpad length of the first bondpad, a second die contact that is exposed at the first substrate surface and that is elongated and connected to the second bondpad across the second bondpad length of the second bondpad, and a conductive structure aligned in parallel with the first and second bondpad lengths and connected between the first and second die contacts, wherein the conductive structure is formed from portions of the patterned conductive layers and at least two vias of the plurality of conductive vias, wherein the conductive structure corresponds to the impedance inverter/phase delay element of the Doherty power amplifier with a first end coupled to the first output of the first amplifier, and a second end coupled to the second output of the second amplifier and to the combining node.

19. The amplifier system of claim 18, wherein:

the system substrate includes a heat extraction component; and the power amplifier device further includes one or more thermal structures contacting second surfaces of the first and second power transistor dies and connected to the heat extraction component of the system substrate.

20. The power amplifier device of claim 1, wherein the substrate further comprises:

an output conductor formed from a portion of one of the multiple patterned conductive layers, wherein an end of the output conductor is connected to and aligned over the second die contact.

21. The power amplifier device of claim 1, wherein the conductive structure extends over and between the second sides of the first and second power transistor dies.

* * * * *